United States Patent
Kawasaki et al.

(10) Patent No.: US 6,614,076 B2
(45) Date of Patent: Sep. 2, 2003

(54) EL DISPLAY DEVICE HAVING A PIXEL PORTION AND A DRIVER CIRCUIT

(75) Inventors: Ritsuko Kawasaki, Kanagawa (JP); Hidehito Kitakado, Hyogo (JP); Kenji Kasahara, Kanagawa (JP); Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 09/905,587

(22) Filed: Jul. 13, 2001

(65) Prior Publication Data

US 2001/0045558 A1 Nov. 29, 2001

Related U.S. Application Data

(63) Continuation of application No. 09/532,690, filed on Mar. 22, 2000, now Pat. No. 6,281,552.

(30) Foreign Application Priority Data

Mar. 23, 1999 (JP) ............................. 11-078715

(51) Int. Cl.[7] .................. H01L 29/04; H01L 31/20; H01L 31/036; H01L 31/0376; H01L 27/01
(52) U.S. Cl. .............. 257/350; 257/59; 257/72; 257/344; 257/351; 257/408
(58) Field of Search ............. 257/59, 72, 350, 257/351, 344, 408

(56) References Cited

U.S. PATENT DOCUMENTS

| 5,247,190 A | | 9/1993 | Friend et al. ............ 257/40 |
| 5,262,655 A | * | 11/1993 | Ashida .................. 257/66 |
| 5,323,042 A | * | 6/1994 | Matsumoto ............ 257/350 |
| 5,399,502 A | | 3/1995 | Friend et al. ............ 437/1 |
| 5,496,756 A | * | 3/1996 | Sharma et al. |
| 5,554,548 A | * | 9/1996 | Sundaresan |
| 5,594,569 A | | 1/1997 | Konuma et al. ......... 349/122 |
| 5,643,826 A | | 7/1997 | Ohtani et al. ........... 437/88 |
| 5,903,014 A | * | 5/1999 | Ino et al. .............. 257/66 |
| 5,923,962 A | | 7/1999 | Ohtani et al. .......... 438/150 |
| 5,998,841 A | | 12/1999 | Suzawa ................ 257/350 |
| 6,046,479 A | | 4/2000 | Young et al. ........... 257/350 |
| 6,166,397 A | | 12/2000 | Yamazaki et al. ....... 257/350 |
| 6,166,414 A | | 12/2000 | Miyazaki et al. ........ 257/369 |
| 6,172,671 B1 | | 1/2001 | Shibuya et al. ......... 345/205 |
| 6,180,982 B1 | | 1/2001 | Zhang et al. ........... 257/347 |
| 6,281,552 B1 | * | 8/2001 | Kawasaki et al. ....... 257/350 |

FOREIGN PATENT DOCUMENTS

| JP | 7-130652 | 5/1995 |
| JP | 10-092576 | 4/1998 |
| WO | WO 90/13148 | 11/1990 |

OTHER PUBLICATIONS

Hatano, M. et al, "A Novel Self–Aligned Gate–Overlapped LDD Poly–Si TFT with High Reliability and Performance," IEDM Technical Digest 97, pp. 523–526.

(List continued on next page.)

*Primary Examiner*—Ngân V. Ngô
(74) *Attorney, Agent, or Firm*—Cook, Alex, McFarron, Manzo, Cummings & Mehler, Ltd.

(57) ABSTRACT

To improve the operation characteristic and reliability of a semiconductor device by optimizing the structure of bottom gate type or inverted stagger type TFTs arranged in circuits of the semiconductor device in accordance with the function of the respective circuits. At least LDD regions that overlap with a gate electrode are formed in an N channel type TFT of a driving circuit, and LDD regions that do not overlap with the gate electrode are formed in an N channel type TFT of a pixel matrix circuit. The concentration of the two kinds of LDD regions is differently set from each other, to thereby obtain the optimal circuit operation.

34 Claims, 16 Drawing Sheets

OTHER PUBLICATIONS

Shimokawa, R. et al, "Characterization of High–Efficiency Cast–Si Solar Cell Wafers by MBIC Measurement," Japanese Journal of Applied Physics, vol. 27, No. 5, pp. 751–758, May, 1988.

Yoshida, T. et al, "A Full Color Thresholdless Antiferroelectric LCD Exhibiting Wide Viewing Angle with Fast Response Time," SID 97 Digest, pp. 841–844, 1997.

Furue, H. et al, "Characteristics and Driving Scheme of Polymer–Stabilized Monostable FLCD Exhibiting Fast Response Time and High Contrast Ratio with Gray–Scale Capability," SID 98 Digest, pp. 782–785, 1998.

Schenk, H. et al, "Polymers for Light Emitting Diodes," EURODISPLAY '99, Proceedings of the 19th International Display Research Conference, Berlin, Germany, Sep. 6–9, 1999, pp. 33–37.

English abstract re Japanese patent application No. 7–130652, published May 19, 1995.

English abstract re Japanese patent application No. 10–092576, published Apr. 10, 1998.

* cited by examiner

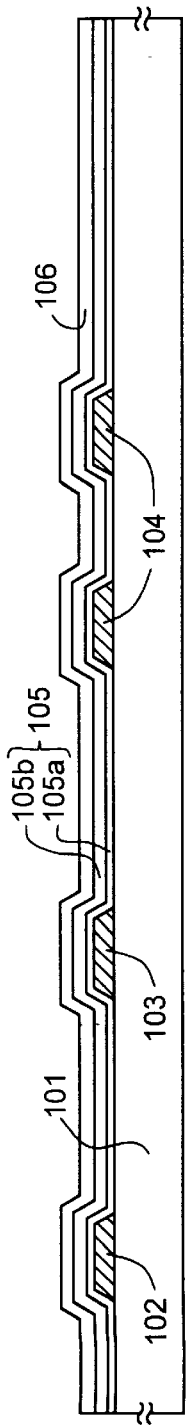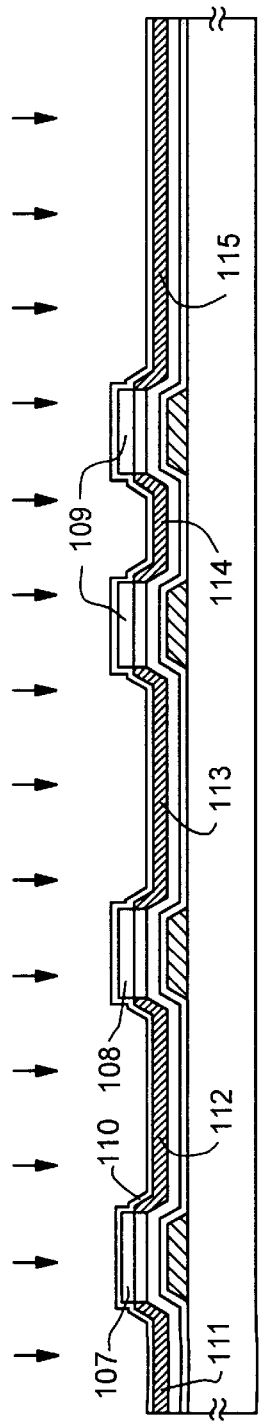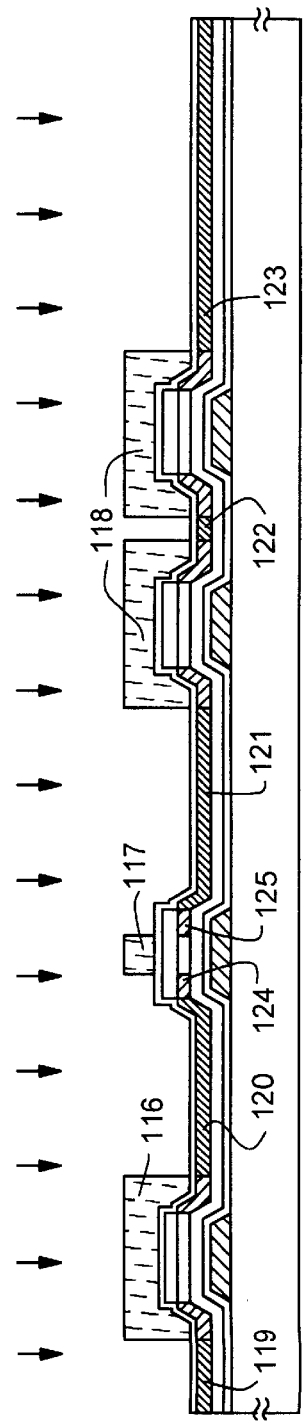

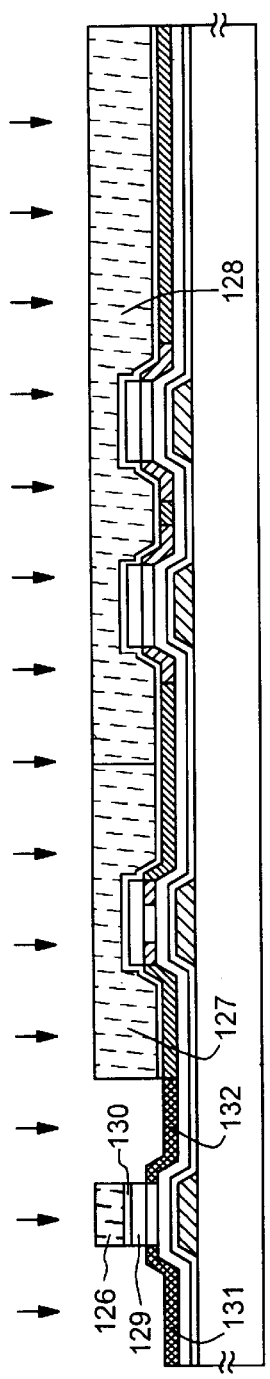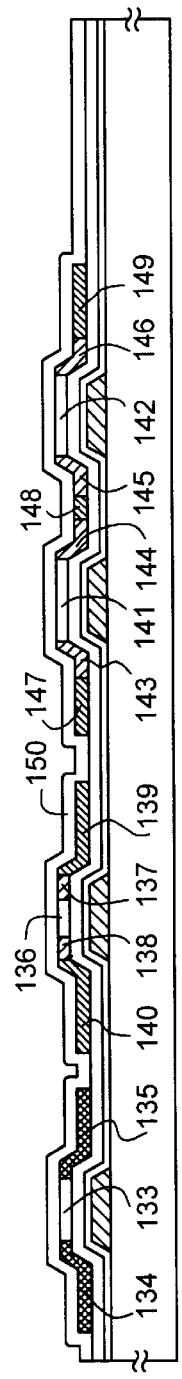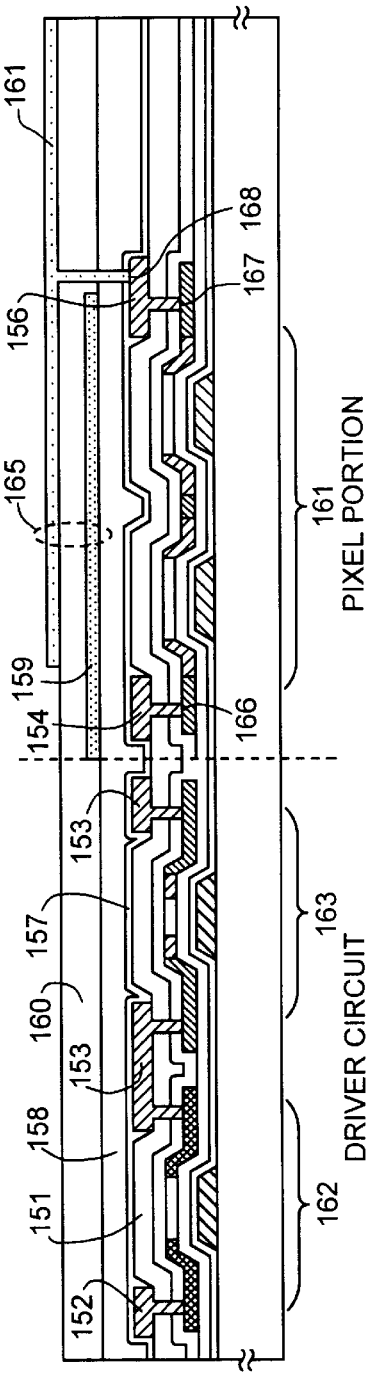

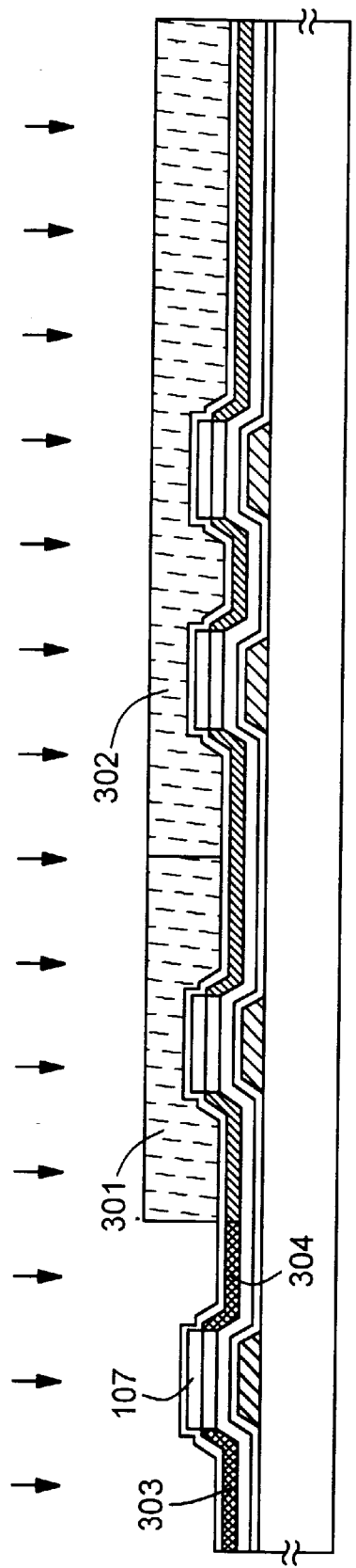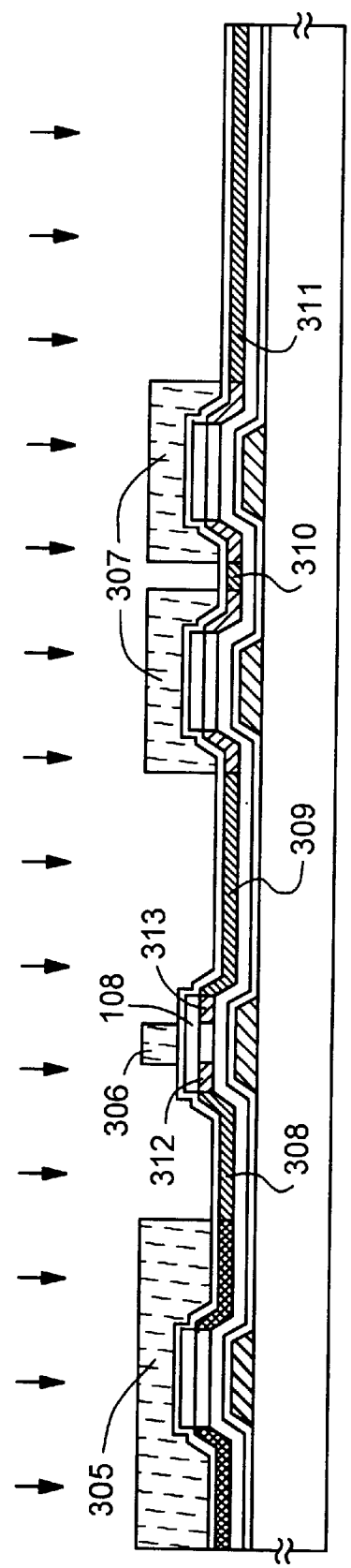

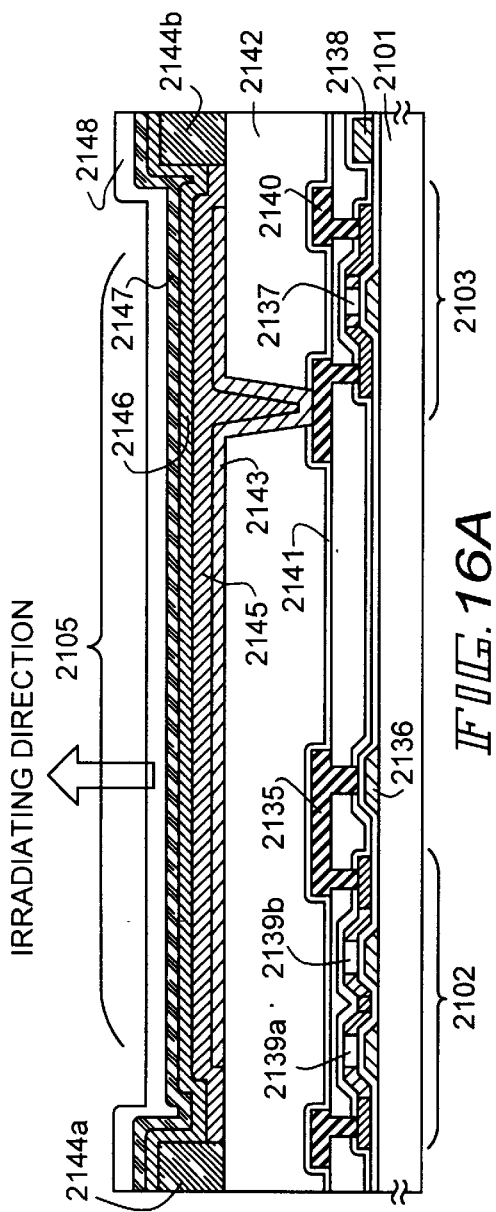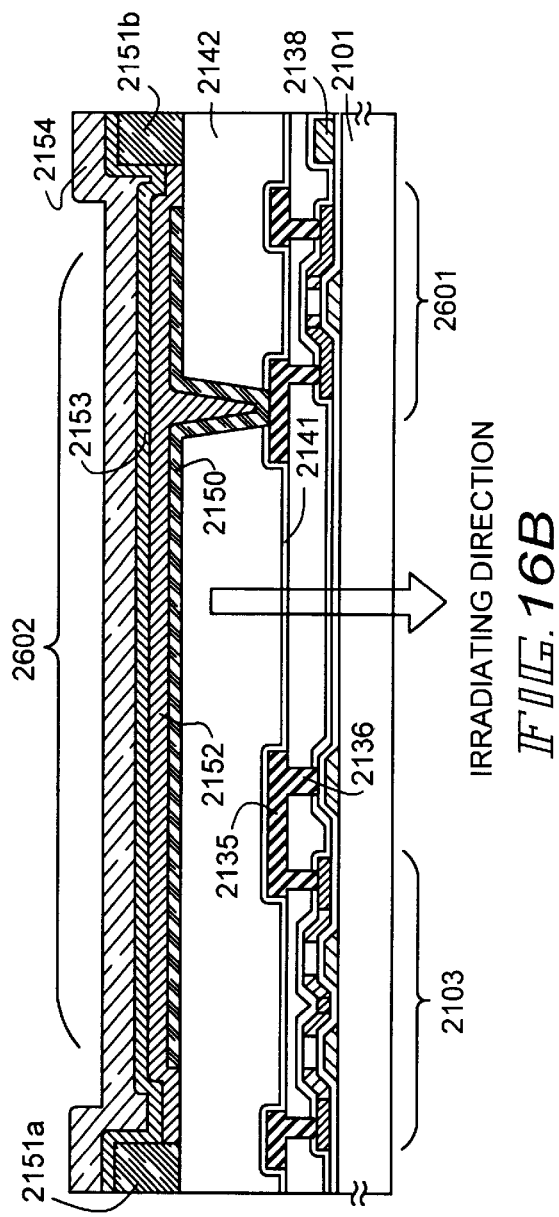

EL DISPLAY DEVICE HAVING A PIXEL PORTION AND A DRIVER CIRCUIT

This application is a continuation of U.S. application Ser. No. 09/532,690, filed on Mar. 22, 2000, now U.S. Pat. No. 6,281,552.

BACKGROUND OF THE INVENTION

1. Field of the Invention

The present invention relates to a semiconductor device that has circuits formed from thin film transistors (hereinafter referred to as TFT) on a substrate having an insulating surface, and to a method of manufacturing the same. More specifically, the present invention is suitably applied to an electro-optical device represented by a liquid crystal display device in which a pixel portion (or, a pixel matrix circuit) and a driver circuit provided in the periphery thereof are formed on the same single substrate, and to an electronic equipment equipped with such electro-optical device. Incidentally, the 'semiconductor device' in this specification refers to devices in general which utilizes semiconductor characteristics to function and, therefore, the electro-optical device and the electronic equipment equipped with the electro-optical device mentioned above are contained in the category.

The progress has been made in developing a semiconductor device that has circuits formed from TFTs on substrates having an insulating surface. Active matrix liquid crystal display devices are well known as a typical example of such semiconductor device. In particular, great effort is put into the development of the electro-optical device with TFTs whose active layers are made of crystalline silicon films (hereinafter referred to as crystalline silicon TFT) integrally formed on the same single substrate, for these TFTs are high in field effect mobility and hence afford to form various functional circuits.

For instance, an active matrix liquid crystal display device is provided with a pixel portion displaying an image, a driver circuit used to display an image, etc. The driver circuit is comprised of circuits formed by using CMOS circuits as the base, such as a shift register circuit, a level shifter circuit, a buffer circuit, and a sampling circuit. Those circuits are mixedly mounted on the same single substrate.

When taking a look at those circuits separately, one does not always share its operation condition with others, which causes no small difference in characteristics required for the TFTs. For example, the pixel portion is comprised of a pixel TFT formed from an N channel TFT and of a holding capacitor, and is driven by applying voltage to liquid crystal while using the pixel TFT as a switching element. Since liquid crystal is driven with alternating current, a system called frame inversion driving is often used. In this system, characteristic required for the pixel TFT to keep power consumption low is to reduce sufficiently the OFF current value (drain current flowing at the time of OFF operation of the TFT). On the other hand, in the driver circuit, the withstand voltage has to be enhanced lest its buffer circuit to which a high driving voltage is applied is broken upon application of the high voltage. Also, securing enough ON current (drain current flowing at the time of OFF operation of the TFT) is required to enhance current drive performance.

However, there is a problem in that the OFF current of crystalline silicon TFTs tend to take a large value. In addition, degradation phenomena such as lowering of ON current value are observed in crystalline silicon TFTs, similar to MOS transistors used in ICs and the like. The main cause of the phenomena could be hot carrier injection: it is surmised that hot carriers generated by the high electric field in the vicinity of the drain bring about the degradation phenomena.

A TFT structure known as useful in reducing OFF current is the lightly doped drain (LDD) structure. According to this structure, a region doped with an impurity element in a low concentration is formed between a channel formation region and a source region, or a drain region, that is doped with a high concentration of impurity element. This lightly doped region is called LDD region.

Also known as measures for preventing the degradation brought by hot carriers is a 'GOLD' structure (Gate-drain Overlapped LDD) in which the LDD region is arranged so as to overlap with a gate electrode through a gate insulating film. These structures release the high electric field in the vicinity of the drain to prevent the hot carrier injection, and hence is effective in preventing the degradation phenomena. For instance, an article written by Mutuko Hatano, Hajime Akimoto and Takeshi Sakai in IEDM97TECHNICAL DIGEST on pages 523 to 526 in 1997 discloses a GOLD structure formed from side walls of silicon, which verifies that very excellent reliability can be obtained with the GOLD structure compared to TFTs having other structure.

Required characteristics, however, is not always the same for the pixel TFT of the pixel portion and for the TFTs of the driver circuit, such as the shift register or the buffer circuit. To give an example, a large reverse bias (negative voltage in the N channel TFT) is applied to the gate in the pixel TFT while the TFTs of the driver circuit do not basically operate under the reverse bias state. Also, the pixel TFT operates at a speed ¹⁄₁₀₀ times the operation speed of the TFTs in the driver circuit.

In addition, GOLD structures have a problem in that, though high in the effect to prevent the degradation of ON current value, OFF current value is larger than in usual LDD structures. Thus the GOLD structures are not preferable in application to the pixel TFT. On the other hand, usual LDD structures are high in the effect to suppress OFF current value but is low in the effect to release the electric field in the vicinity of the drain and prevent the degradation due to hot carriers. It is thus not always preferable to form all TFTs to have the same structure in a semiconductor device that has a plurality of integrated circuits different from one another in the operation condition, as in active matrix liquid crystal display devices. The problem as such comes to the front especially as the characteristics of crystalline silicon TFTs are enhanced and more is demanded for the performance of active matrix liquid crystal display devices.

SUMMARY OF THE INVENTION

The present invention involves techniques for solving the problems above, and an object of the present invention is to improve operation characteristics and reliability of a semiconductor device by optimizing the structure of TFTs arranged in various circuits of the semiconductor device in accordance with the function of the respective circuits.

In order to attain the above object, according to the present invention, a semiconductor device having a pixel portion and a driver circuit for the pixel portion on the same single substrate is characterized in that:

each of the pixel portion and the driver circuit is provided with at least an N channel type TFT that has an active layer, LDD regions formed in the active layer, a gate insulating film formed between the active layer and the substrate, and a gate electrode formed between the gate insulating film and the substrate;

the LDD region in the N channel type TFT of the pixel portion is arranged so as not to overlap with the gate electrode in the N channel type TFT of the pixel portion;

the LDD region in the N channel type TFT of the driver circuit is arranged so as to overlap with the gate electrode in the N channel type TFT of the driver circuit; and the LDD region in the N channel type TFT of the driver circuit contains a higher concentration of impurity element for imparting N type than the LDD region in the N channel type TFT of the pixel portion does.

The semiconductor device is also characterized in that the LDD region in the N channel type TFT of the driver circuit contains an impurity element for imparting N type in a concentration two or more times higher than the LDD region in the N channel type TFT of the pixel portion does, but the concentration in the former LDD region does not exceed ten times the concentration in the latter LDD region.

The semiconductor device is also characterized in that an organic resin film is formed on, at least, the N channel type TFT of the pixel portion, and in that a capacitor is comprised of a light-shielding film formed on the organic resin film, a dielectric film formed in close contact with the light shielding film, and a pixel electrode that is formed so as to partially overlap with the light-shielding film and is connected to the N channel TFT of the pixel portion.

In order to attain the above object, according to the present invention, a method of manufacturing a semiconductor device having a pixel portion and a driver circuit for the pixel portion on the same single substrate is characterized in that:

a step of forming an N channel TFT in each of the pixel portion and the driver circuit is included, the N channel TFT having an active layer, LDD regions formed in the active layer, a gate insulating film formed between the active layer and the substrate, and a gate electrode formed between the gate insulating film and the substrate;

the LDD region in the N channel type TFT of the pixel portion is arranged so as not to overlap with the gate electrode in the N channel type TFT of the pixel portion;

the LDD region in the N channel type TFT of the driver circuit is arranged so as to overlap with the gate electrode in the N channel type TFT of the driver circuit; and the LDD region in the N channel type TFT of the driver circuit is doped with a higher concentration of impurity element for imparting N type than the LDD region in the N channel type TFT of the pixel portion.

The method of manufacturing a semiconductor device is also characterized in that the LDD region in the N channel type TFT of the driver circuit contains an impurity element for imparting N type in a concentration two or more times higher than the LDD region in the N channel type TFT of the pixel portion does, but the concentration in the former LDD region does not exceed ten times the concentration in the latter LDD region.

The method of manufacturing a semiconductor device is also characterized in that a capacitor is formed through the steps of: forming an organic resin film on, at least, the N channel type TFT of the pixel portion; forming a light-shielding film on the organic resin film; forming a dielectric film in close contact with the light shielding film: and forming a pixel electrode that partially overlaps with the light-shielding film and is connected to the N channel TFT of the pixel portion.

FIGS. 5A and 5B are explanatory views showing the structure of the present invention. The figures illustrate the positional relationship between a gate electrode and an LDD region in a bottom gate type or inversed stagger type TFT that has an active layer, LDD regions formed in the active layer, a gate insulating film formed between the active layer and said substrate, and the gate electrode formed between the gate insulating film and said substrate.

FIG. 5A shows a structure in which a gate insulating film 502 and a gate electrode 501 are formed under an active layer having a channel formation region 503, an LDD region 504 and a drain region 505. The LDD region 504 is formed so as to overlap with the gate electrode 501 through the gate insulating film 502. The LDD region as such is referred to as Lov in this specification. The Lov has an effect to release the high electric field generated in the vicinity of the drain to prevent degradation due to hot carriers and hence is suitable for use in the N channel type TFT of the driver circuit.

In FIG. 5B, a channel formation region 508, an LDD region 509 and a drain region 510 are formed in an active layer on an gate insulating film 507. The LDD region 509 is formed so as not to overlap with a gate electrode 506. The LDD region as such is referred to as Loff in this specification. The Loff is effective in reducing OFF current value, and is suitable for use in the N channel type TFT of the pixel portion.

As described above, the present invention is characterized in that a semiconductor device having a pixel portion and a driver circuit thereof takes a structure in which the pixel portion is provided with an N channel type TFT with Loff while the driver circuit is provided with an N channel type TFT with Lov, and in that the TFTs are of bottom gate type or inversed stagger type.

BRIEF DESCRIPTION OF THE DRAWINGS

FIGS. 1A to 1C are sectional views showing a process of manufacturing a pixel portion and a driver circuit of Embodiment 1;

FIGS. 2A to 2C are sectional views showing the process of manufacturing the pixel portion and the driver circuit of Embodiment 1;

FIGS. 3A and 3B are sectional views showing another process of manufacturing a pixel portion and a driver circuit of Embodiment 2;

FIGS. 16A and 16B are sectional views of a pixel portion of the EL display device of Embodiment 8;

DETAILED DESCRIPTION OF THE PREFERRED EMBODIMENTS

Figure 4A:
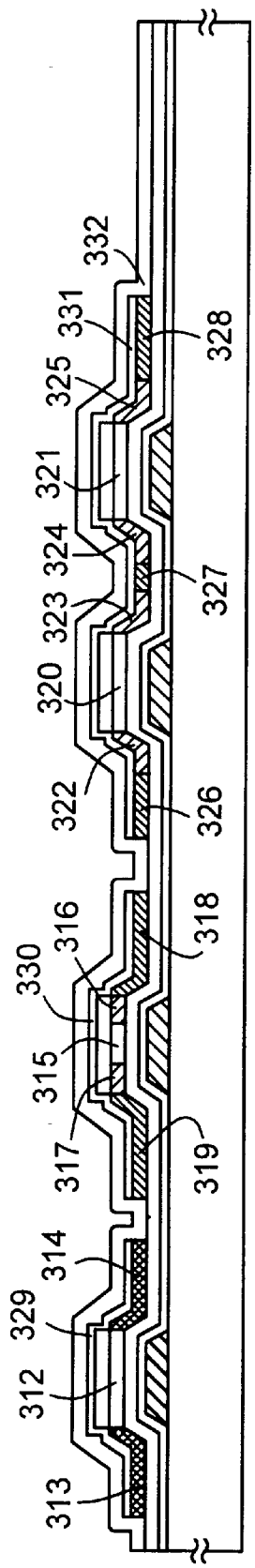
FIGS. 4A and 4B are sectional views showing the process of manufacturing the pixel portion and the driver circuit of Embodiment 2.

A mode for carrying out the present invention will be described in detail by means of Embodiments shown below.

Embodiment 1

This embodiment will be described with reference to FIGS. 1A to 2C. Here, a detailed description will be given in order on steps for manufacturing simultaneously TFTs for a pixel portion and for a driver circuit provided in the periphery of the pixel portion.

Formation of Gate Electrode, Gate Insulating Film and Semiconductor Layer: FIG. 1A In FIG. 1A, a low alkaline glass substrate or a quartz substrate is used for a substrate 101. On one surface of this substrate 101 where a TFT is to be formed, a base film made of, for example, a silicon oxide film, a silicon nitride film, and a silicon nitride oxide film may optionally be formed (not shown). Gate electrodes 102 to 104 are formed such that a coating is formed of an element selected from tantalum (Ta), titanium (Ti), tungsten (W), molybdenum (Mo) and aluminum (Al) or of a material containing mainly any one of these elements by a known film deposition method such as sputtering and vacuum evaporation and the coating is then formed into a pattern by etching the coating so that the end faces thereof are tapered. For example, a Ta film is formed by sputtering to have a thickness of 200 nm, a resist mask is formed into a given shape, and the film is subjected to plasma etching treatment with a mixed gas of $CF_4$ and $O_2$ so as to have a desired shape. The gate electrodes may have a two-layer structure consisting of a tantalum nitride (TaN) film and a Ta film, or of a tungusten nitride (WN) film and a W film (not shown). Gate wirings to be connected to the gate electrodes are formed at the same time, though not shown.

A gate insulating film 105 is formed of a material containing silicon nitride to have a thickness of 10 to 200 nm, preferably 50 to 150 nm. For instance, a silicon nitride film 105a made of a raw material of $SiH_4$, $NH_3$ and $N_2$ and having a thickness of 50 nm and a silicon nitride oxide film 105b made of a raw material of $SiH_4$, and $N_2O$ and having a thickness of 75 nm are formed by plasma CVD and layered one on the other to form the gate insulating film. Of course, the gate insulating film may be comprised of a single layer of a silicon nitride film or a silicon oxide film, which causes no trouble. In order to obtain a clean surface, it is effective to conduct plasma hydrogen treatment prior to the film deposition of the gate insulating film.

Next, an amorphous silicon film with a thickness of 20 to 150 nm is formed in close contact with the gate insulating film 105 by a known film deposition method such as plasma CVD and sputtering. Though no limitation is put on the forming condition of the amorphous silicon film, it is preferable to reduce impurity elements such as oxygen and nitrogen contained in the film to a concentration of $5 \times 10^{18}$ $cm^{-3}$ or less. The gate insulating film and the amorphous silicon film can be formed by the same film deposition method, so that the two may be formed successively. In this case, avoiding exposure to the air atmosphere once the gate insulating film is formed makes it possible to prevent contamination of the surface of the gate insulating film, to thereby reduce fluctuation in characteristics of the TFTs to be manufactured and variation in the threshold voltage. Thereafter a crystalline silicon film 106 is formed using a known crystallizing technique. For example, laser crystallization, thermal crystallization (solid phase growth method) or a crystallizing method using a catalytic element may be employed.

A region of the crystalline silicon film 106 where the N channel type TFT is to be formed may be doped with boron (B) in a concentration of $1 \times 10^{16}$ to $5 \times 10^{17}$ $cm^{-3}$ with the intention of controlling the threshold voltage. This boron doping may be conducted by ion doping or may be conducted at the same time as the film deposition of the amorphous silicon film.

Formation of Spacer Film, Formation of $N^-$ Region: FIG. 1B

Next, doping with an impurity element for imparting N type is conducted in order to form the LDD region in the N channel type TFT of the pixel portion. A silicon oxide film or a silicon nitride film with a thickness of 100 to 200 nm, for example, 120 nm is formed on the entire surface of the crystalline silicon film 106. After forming a photoresist film on the entire surface of this silicon oxide film or silicon nitride film, the photoresist film is exposed to light from its back surface using the gate electrodes 102 to 104 as masks to form a resist mask on the gate electrodes (not shown). At this point, the resist mask can be formed to have almost the same width as that of the gate electrodes by optimizing the exposure time and intensity of light irradiation. Then utilizing this resist mask, unnecessary portion is etched and removed to form first spacer films 107 to 109 made of a silicon oxide film or a silicon nitride film. A second spacer film 110 with a thickness of 50 nm is further formed thereon.

Through the second spacer film 110, the crystalline silicon film below the film 110 is doped with an impurity element for imparting N type by ion doping. The phosphorus (p) concentration in the thus formed impurity regions 111 to 115 desirably ranges from $1 \times 10^{17}$ $cm^{-3}$ to $2.5 \times 10^{18}$ $cm^{-3}$, $2 \times 10^{17}$ $cm^{-3}$, in this embodiment. The concentration of the impurity element for imparting N type contained in the impurity regions 111 to 115 is expressed as ($n^-$) in this specification.

Formation of $N^-$ Region and $N^+$ Region: FIG. 1C

The next step is to form impurity regions that functions as a source region or a drain region in the N channel TFT and to form the LDD region in the N channel TFT of the driver circuit. Here, masks 116 to 118 are formed from resist by a normal exposure. The mask 116 is formed so as to cover at least a portion to be a channel formation region of a P channel TFT. The mask 118 is formed in the N channel TFT of the pixel portion so as to cover portions to be the channel formation region and the LDD region, respectively. The mask 117 is formed so as to cover a portion to be the channel formation region in the N channel TFT of the driver circuit. Ion doping (or, ion injection) is conducted to form impurity regions 119 to 123 which are doped with an impurity element for imparting N type through the second spacer film 110 and to form impurity regions 124, 125 which are doped with an impurity element for imparting N type through the second spacer film 110 and the first spacer film 108. The impurity regions 119 to 123 contain the impurity element in a concentration of $1 \times 10^{20}$ to $1 \times 10^{21}$ cm$^{-3}$, $5 \times 10^{20}$ cm$^{-3}$, in this embodiment. The concentration thereof is expressed as (n$^+$) in this specification. The impurity regions 124, 125 contain the impurity element in a concentration of $2 \times 10^{17}$ to $5 \times 10^{18}$ cm$^{-3}$, $6 \times 10^{17}$ cm$^{-3}$, in this embodiment. The concentration thereof is expressed as (n$^-$) in this specification.

Formation of P$^+$ Region: FIG. 2A

The next step is doping with an impurity element for imparting P type to form a source region and a drain region in the P channel type TFT of the driver circuit. In order to secure the channel formation region of the P channel type TFT, a new resist mask 126 is formed here on the second spacer film 110. Etching treatment is performed on the first spacer film and the second spacer film to form new spacer films 129, 130, exposing at the same time the surface of the crystalline silicon film. Upon this etching treatment, regions where the N channel type TFTs are to be formed are covered with resist masks 127, 128. Impurity regions 131, 132 are then formed through ion doping (ion injection also will do) using dibolane (B$_2$H$_6$). The boron (B) concentration in these regions is $1.5 \times 10^{20}$ to $3 \times 10^{21}$ cm$^{-3}$, $1 \times 10^{21}$ cm$^{-3}$, in this embodiment. The concentration of the impurity element for imparting P type contained in the impurity regions 131, 132 is expressed as (p$^+$) in this specification. As shown in FIGS. 1A to 1C, regions where phosphorus (P) is mixed in are formed in a part of the impurity regions 131, 132. However, P type conductivity thereof is secured by setting the boron (B) concentration in the doping of this step to a value 1.5 to 3 times the concentration of phosphorus mixed in the regions, effecting no influence on characteristics of the TFTs.

Formation of First Interlayer Insulating Film, Thermal Activation Step, Hydrogenation Step: FIG. 2B After the crystalline silicon film is selectively doped with the respective impurity elements, the first and the second spacer films are removed and the crystalline silicon film is divided into island like shapes through etching treatment. A protective insulating film 150 that will later form a part of a first interlayer insulating film is formed. The protective insulating film 150 may be a silicon nitride film, a silicon oxide film, a silicon nitride oxide film, or a laminate film in which a combination of these films are layered. The film thickness thereof ranges from 100 nm to 400 nm.

After that, a heat treatment step is conducted to activate the impurity elements for imparting N type and P type added in the respective densities. This step may adopt furnace annealing, laser annealing, rapid thermal annealing (RTA), etc. Here, the activation is made by furnace annealing. The heat treatment is performed in a nitrogen atmosphere at 300 to 650° C., preferably 500 to 550° C., 525° C., in this embodiment, for four hours. Further heat treatment is carried out in an atmosphere containing 3 to 100% hydrogen at 300 to 450° C. for one to twelve hours to hydrogenate the active layer. This step is for terminating dangling bonds in the active layer with thermally excited hydrogen. Other hydrogenating method includes plasma hydrogenation (which uses hydrogen excited by plasma).

When the crystalline silicon film 106 to be the active layer is formed from the amorphous silicon film by a crystallizing method that uses catalytic element, a small amount of catalytic element is remained in the crystalline silicon film 106. The remaining catalytic element does not cause trouble in completing the TFT and in operation of the TFT, of course. Nevertheless, it is preferred to remove the remaining catalytic element at least from the channel formation region. One of measures for removing the catalytic element is a method that utilizes gettering effect brought by phosphorus (P). The concentration of phosphorus (P) required for gettering is approximately the same as in the impurity region (n$^+$) formed in the step illustrated in FIG. 1C. Through the heat treatment conducted in the activation step, the catalytic element is gettered from the channel formation regions in the N channel TFT and the P channel TFT to be moved to surrounding impurity regions doped with phosphorus (P).

Formation of Interlayer Insulating Film, Formation of Source Wiring and Drain Wiring, Formation of Passivation Film, and Formation of Pixel Electrode: FIG. 2C Upon completion of the activation step, an interlayer insulating film 151 with a thickness of 500 to 1500 nm is formed on the protective insulating film 150. The protective insulating film 150 and the interlayer insulating film 151 constitute a lamination film, which serves as a first interlayer insulating film. Then contact holes reaching to the source regions or the drain regions of the respective TFTs are formed to form source wirings 152, 153, 154 and drain wirings 155, 156. Though not shown, in this embodiment, the electrodes thus formed are made of a lamination film of three-layer structure which is obtained by using sputtering to successively form and layer a Ti film with a thickness of 100 nm, an aluminum film containing Ti and having a thickness of 300 nm and another Ti film with a thickness of 150 nm.

The protective insulating film 150 and the interlayer insulating film 151 may be formed from a silicon nitride film, a silicon oxide film or a silicon nitride oxide film. In any case, the internal stress of these films is preferably compression stress.

Next, a passivation film 157 with a thickness of 50 to 500 nm (typically, 100 to 300 nm) is formed using a silicon nitride film, a silicon oxide film or a silicon nitride oxide film. Subsequent hydrogenation treatment performed on the device in this state brings a preferable result with respect to improvement of the characteristics of the TFTs. An appropriate hydrogenation treatment is, for example, a heat treatment conducted in an atmosphere containing 3 to 100% hydrogen at 300 to 450° C. for one to twelve hours. Plasma hydrogenation can present the same effect. An opening may be formed at this point in the passivation film 157 at a position where contact holes for connecting a pixel electrode to the drain wirings are to be formed later.

Thereafter, a second interlayer insulating film 158 made of an organic resin film is formed to have a thickness of about 1 μm. Usable organic resin films include films of polyimide, acrylic resin, polyamide, polyimideamide, BCB (benzocyclobutene), etc. Here in this embodiment, polyimide of the type to be thermally polymerized after applied to the substrate is used and burned at 300° C. to form the second interlayer insulating film. A light-shielding film 159 is next formed on the second interlayer insulating film 158 in a region to be the pixel portion. The light-shielding film 159 is a film mainly containing one or plural kinds of elements selected from Al, Ti and Ta, and has a thickness of 100 to 300 nm. Patterning is performed on the light-shielding film 159 so that the film has a given shape. A third interlayer insulating film 160 is further formed thereon using an organic resin film as in forming the second interlayer insulating film. The thickness of the third interlayer insulating film 160 is 0.5 to 1 μm. A contact hole reaching to a drain wiring 156 is then formed through the third interlayer insulating film 160, the second interlayer insulating film 158 and the passivation film 157 to form a pixel electrode 161. A transparent conductive film is used to form the pixel electrode 161 in the case of manufacturing a transmission type liquid crystal display device, and a metal film is used if in the case of a reflection type liquid crystal display device. Since it is a transmission type liquid crystal display device that is to be manufactured in this embodiment, an indium tin oxide film with a thickness of 100 nm is formed by sputtering.

Through the steps above, an active matrix substrate is completed which has a pixel portion and a driver circuit thereof formed on the same substrate. In the driver circuit where an N channel type TFT 163 and a P channel type TFT 162 are formed, a logic circuit having a CMOS circuit as the base may also be formed. In the pixel portion, an N channel TFT 164 is formed and a holding capacitor 165 is further formed from the light-shielding film 159, the third interlayer insulating film 160 and the pixel electrode 161.

The P channel type TFT 162 in the driver circuit has a channel formation region 133, a source region 134, and a drain region 135. The N channel type TFT 163 has, in addition to a channel formation region 136, a source region 139 and a drain region 140, LDD regions (Lov regions) 137, 138 which overlap with the gate electrode. The N channel type TFT 164 in the pixel portion has, in addition to a channel formation regions 141, 142, a source region 147 and drain regions 148, 149, LDD regions (Loff) 143 to 146 which do not overlap with the gate electrode. The LDD regions in the N channel type TFT of the driver circuit are provided with the major intention of releasing the high electric field in the vicinity of the drain to prevent degradation of the ON current value due to hot carrier injection. The concentration of the impurity element imparting N type which is suitable for that intention is $5 \times 10^{17}$ to $5 \times 10^{18}$ cm$^{-3}$. On the other hand, the LDD regions in the N channel type TFT of the pixel portion are provided intending mainly to lower the OFF current value.

The length in the channel length direction of the Lov regions in the N channel type TFT of the driver circuit is 0.5 to 3.0 μm, preferably 1.0 to 1.5 μm, with respect to a channel length of 3 to 8 μm. The length in the channel length direction of the Loff regions in the pixel portion is 0.5 to 3.5 μm, typically 1.5 to 2.5 μm. Although the N channel type TFT 164 of the pixel portion which is completed in FIG. 2C has the double gate structure, it may have the single gate structure or the multi-gate structure in which a plurality of gate electrodes are formed.

As described above, with the present invention, the structure of the TFTs constituting the pixel portion and the driver circuit is optimized in accordance with specifications the respective circuits require, improving the operation performance and reliability of the semiconductor device. Concretely, the LDD regions of the N channel type TFTs are differently designed in accordance with specifications of the respective circuits to appropriately form either Lov regions or Loff regions, thereby realizing coexistence on the same substrate of a TFT structure that places importance on countermeasures against hot carriers with a TFT structure that places importance on low OFF current value.

Embodiment 2

With reference to FIGS. 3A to 4B, this embodiment gives a description of the case where a method different from the one in Embodiment 1 is used to simultaneously fabricate TFTs for a pixel portion and for a driver circuit provided in the periphery of the pixel portion.

First, the steps up through the step shown in FIG. 1B are carried out in a manner similar to Embodiment 1. Through which are formed, on a substrate 101, gate electrodes 102 to 104, a gate wiring (not shown), a gate insulating film 105, a crystalline silicon film 106, first spacer films 107 to 109, a second spacer film 110, and impurity regions 111 to 115 doped with an element for imparting N type in a concentration of n$^-$.

The next step is, as shown in FIG. 3A, to dope regions of the crystalline silicon film which are to be a source region and a drain region in a P channel TFT of the driver circuit with an impurity element imparting P type. First, a region where an N channel TFT is to be formed is covered with resist masks 301, 302. Then using the first spacer film 107 as a mask, impurity regions (p$^+$) 303, 304 are formed by ion doping with an impurity element of dibolane (B$_2$H$_6$). These regions are doped to have a boron (B) concentration of $1 \times 10^{21}$ cm$^{-3}$.

Subsequently as in Embodiment 1, impurity regions functioning as a source region or a drain region will be formed in the N channel type TFT as well as LDD regions of the N channel type TFT in the driver circuit. After forming masks 305 to 307 from resist, impurity regions 308 to 311 and impurity regions 312, 313 are formed by ion doping. The impurity regions 308 to 311 are doped through the second spacer film 110 with an impurity element imparting N type, and the impurity regions 312, 313 are doped through the second spacer film 110 and the first spacer film 108 with an impurity element imparting N type. The impurity regions 308 to 311 contain the impurity element in a concentration of $5 \times 10^{20}$ cm$^{-3}$ in this embodiment so as to have n$^+$ concentration. The impurity regions 312, 313 contain the impurity element in a concentration of $6 \times 10^{-17}$ cm$^{-3}$ in this embodiment so as to have n$^-$ concentration.

Figure 4B:
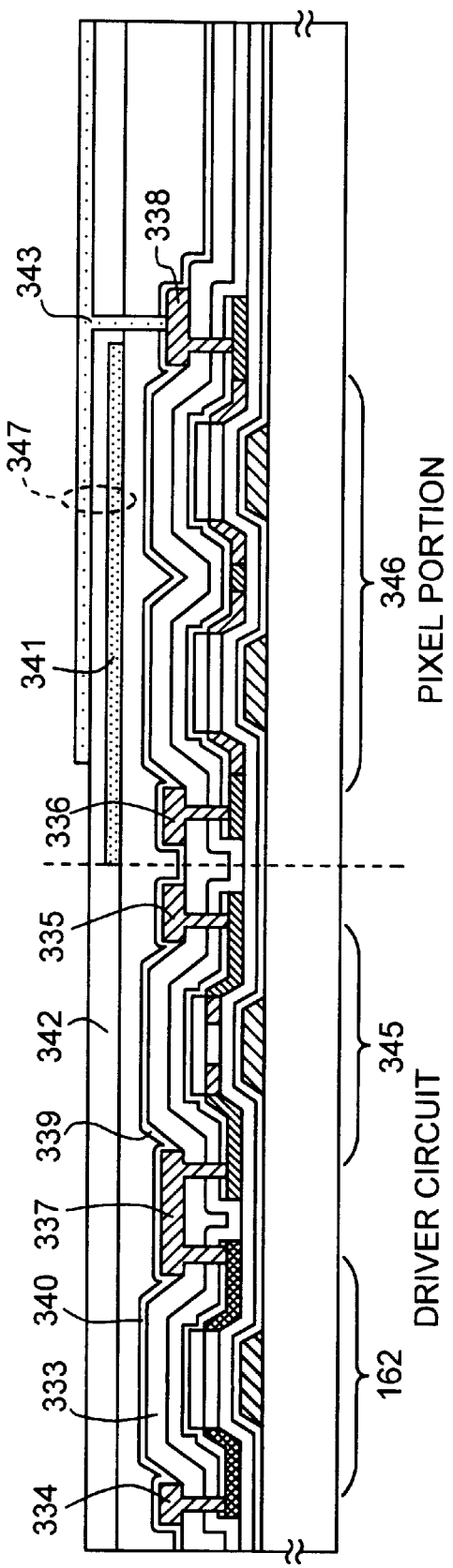
Figure 5A:
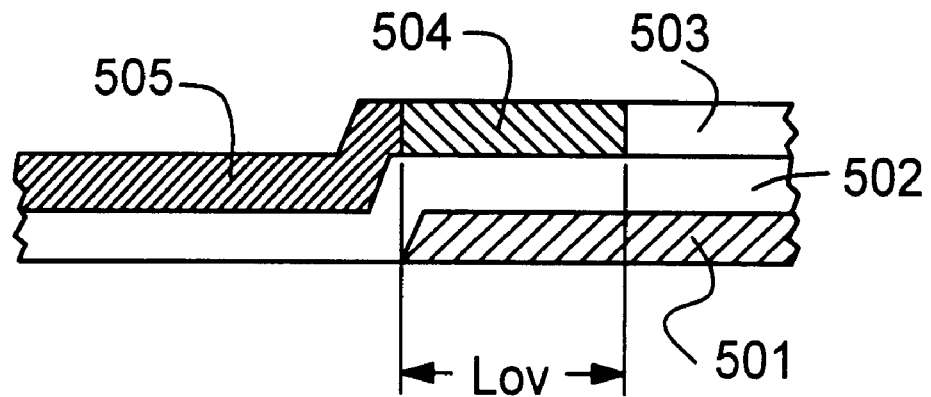
FIGS. 5A and 5B are explanatory views each illustrating the positional relationship between a gate electrode and an LDD region of the present invention.
Figure 5B:
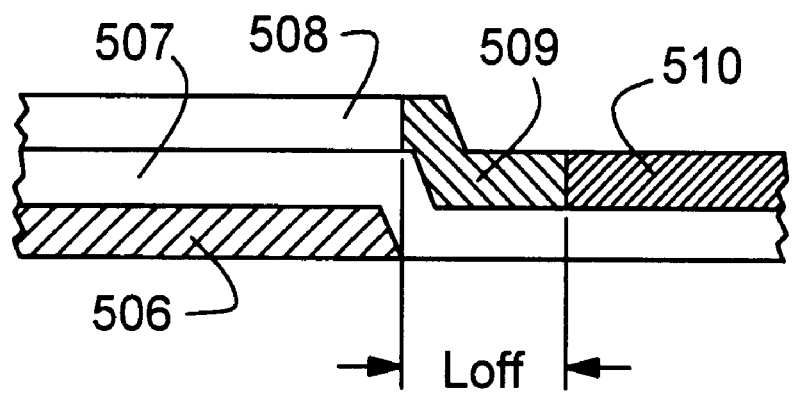

Subsequent steps follow the description of Embodiment 1 in which, as shown in FIG. 4A, a protective film 332 is formed and the activation step is carried out through furnace annealing. A hydrogenation treatment is further performed and then an interlayer insulating film 333 is formed as shown in FIG. 4B to form together with the protective film 332 a first interlayer insulating film having a two-layer structure. Source wirings 334 to 336 and drain wirings 337, 338 are next formed, and a passivation film 339 and a second interlayer insulating film 340 are layered thereon. A light shielding film 341 is then formed on the second interlayer insulating film 340 to form a pixel electrode 343 that is to be connected to a third interlayer insulating film 342 and a drain electrode 338.

Through the above steps, a channel formation region 312, a source region 313 and a drain region 314 are formed in a P channel type TFT 344 of the driver circuit. Formed in an N channel type TFT 345 thereof are a channel formation region 315, Lov regions 316, 317, a source region 318, and a drain region 319. In an N channel type TFT 346 of the pixel portion, channel formation regions 320, 321 and Loff regions 322 to 325 are formed. Further, a holding capacitor 347 connected to the N channel type TFT 346 is formed from the light-shielding film 341, the third interlayer insulating film 342 and the pixel electrode 343.

Embodiment 3

Figure 11A:
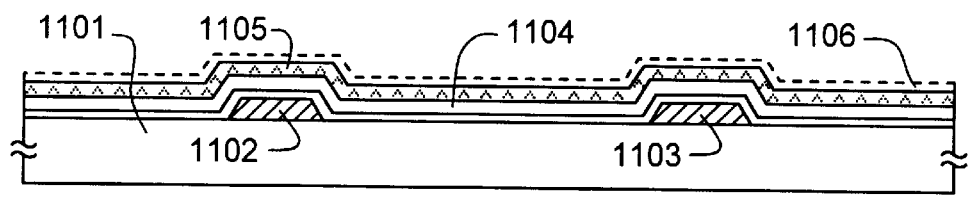
FIGS. 11A to 11C are sectional views showing a process of manufacturing a crystalline semiconductor layer of Embodiment 3.
Figure 11B:
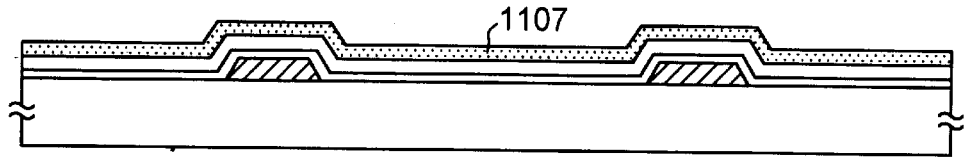
Figure 11C:
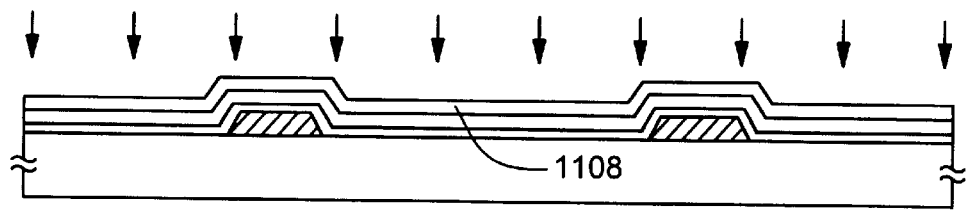

A description given in this embodiment with reference to FIGS. 11A to 11C is about a step of forming a crystalline semiconductor film to be an active layer of a TFT which is shown in Embodiments 1 and 2. First, gate electrodes 1102, 1103 with a thickness of 100 to 400 nm are formed on a substrate 1101 (a glass substrate, in this embodiment). The gate electrodes are made of a material containing one or plural kinds of elements selected from Al, Ti, Ta, Mo, and W, and patterned so that the end faces thereof are tapered. Though not shown, the electrodes may have a laminate structure in which the materials mentioned above are layered. For example, a two-layer structure consisting of a tantalum nitride (TaN) layer and a Ta layer with the TaN layer facing the substrate may be adopted. The surfaces of the gate electrodes may be coated with an oxide formed by anodic oxidation or the like. A gate insulating film 1104 is then formed from a silicon nitride film, a silicon oxide film or a silicon nitride oxide film with a thickness of 20 to 200 nm, preferably 75 to 125 nm. On the gate insulating film 1104, an amorphous semiconductor film (amorphous silicon film, in this embodiment) 1105 having a thickness of 50 nm is formed continuous to the formation of the film 1104 without exposing the films to the air.

An aqueous solution containing a catalytic element (nickel, in this embodiment) of 10 ppm in terms of weight (nickel acetate solution) is applied through spin coating to form a catalytic element containing layer 1106 over the entire surface of the amorphous semiconductor film 1105. Usable catalytic elements for this other than nickel (Ni) include germanium (Ge), iron (Fe), palladium (Pd), tin (Sn), lead (Pb), cobalt (Co), platinum (Pt), copper (Cu) and gold (Au). Although nickel is added to the film by spin coating in this embodiment, another method may be employed in which a thin film of catalytic element (nickel film, in this embodiment) is formed on the amorphous semiconductor film by evaporation or sputtering. (FIG. 11A)

Next, before the crystallization, a heat treatment step is conducted at 400 to 500° C. for about an hour to remove hydrogen from within the film, followed by another heat treatment of 500 to 650° C. (preferably 550 to 570° C.) for 4 to 12 hours (preferably 4 to hours). The heat treatment in this embodiment is at 550° C. for 4 hours, forming a crystalline semiconductor film (crystalline silicon film, in this embodiment) 1107. (FIG. 11B)

The thus formed active layer 1107 is a crystalline semiconductor film with excellent crystallinity owing to the use of catalytic element for promoting crystallization (nickel, in this case). Laser crystallization may additionally be used to enhance its crystallinity. For instance, the crystalline semiconductor film 1107 formed in FIG. 11B is irradiated with a linear beam of XeF excimer laser light (wavelength: 308 nm), setting the oscillation frequency to 5 to 50 Hz, the energy density to 100 to 500 mJ/cm$^2$, and the overlapped ratio of the linear beam to 80 to 98%. As a result, a crystalline semiconductor film 1108 with even more excellent crystallinity is obtained.

When a TFT is fabricated by using the crystalline semiconductor film thus formed on the substrate 1101 and by following the procedures shown in Embodiment 1 or 2, a good TFT characteristic may be attained. TFT characteristic is expressed by, typically, field effect mobility. The TFT made from the crystalline semiconductor film that is formed in accordance with this embodiment shows its characteristics as a field effect mobility of 150 to 220 cm$^2$/V·sec if it is an N channel type TFT, and 90 to 120 cm$^2$/V·sec if it is a P channel type TFT. In addition, characteristic degradation with respect to the initial value is not observed even when the TFT is continuously operated, presenting an excellent characteristic also in view of reliability.

Embodiment 4

In this embodiment, a description will be made with reference to FIGS. 9A to 10B on other structures of the holding capacitor connected to the N channel type TFT in the pixel portion on the active matrix substrate. In the sectional structure shown in FIGS. 9A to 10B, up to the part where a second interlayer insulating film 158 is formed from an organic resin film by following the manufacturing process explained in Embodiment 1 is the same as the structure illustrated in FIGS. 1A to 2C. Therefore, the description given in this embodiment focuses upon differences from Embodiment 1.

Figure 9A:
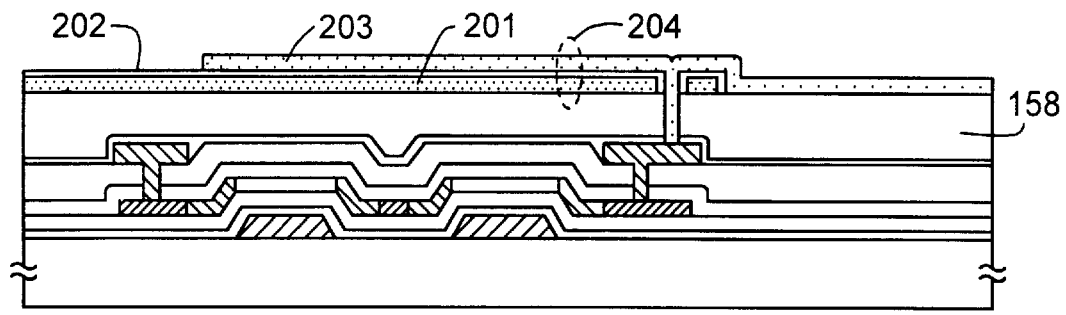
FIGS. 9A to 9C are sectional views showing the structure of a holding capacitor of Embodiment 4.

In FIG. 9A, after forming the second interlayer insulating film 158 in accordance with the process shown in Embodiment 1, a light-shielding film 201 is formed from a material containing elements selected from Al, Ta and Ti. On the surface of the light-shielding film 201, a dielectric film 202 (an oxide film) with a thickness of 30 to 150 nm (preferably 50 to 75 nm) is formed by anodic oxidation.

When the dielectric film 202 is formed by anodic oxidation, a tartaric acid ethylene glycol solution with a sufficiently low concentration of alkaline ion is prepared first. This is a solution made by mixing a 15% tartaric acid ammonium aqueous solution and ethylene glycol at a ratio of 2 to 8. Ammonium water is added to the solution to adjust pH to 7±0.5. Then a platinum electrode serving as a cathode is placed in this solution, the substrate on which the light-shielding film 201 is formed is immersed in the solution, and a constant DC (several mA to several tens mA) is caused to flow using the light-shielding film 201 as an anode. The voltage between the cathode and the anode in the solution changes in time as the oxide grows, requiring adjustment of the voltage in order to keep the current constant. When the voltage reaches 150 V, without holding the voltage to 150 V, or holding the voltage to 150 V for from several seconds to several tens seconds, the anode oxidation treatment is ended. In this way, the dielectric film may be formed avoiding its undesirable overgrowth over the surface where the light-shielding film 201 is in contact with the second interlayer insulating film.

The dielectric film is formed only on the light-shielding film surface in this embodiment, and the dielectric film may be formed by a vapor phase method such as plasma CVD, thermal CVD and sputtering. In this case also, the film thickness is preferably set to 30 to 150 nm (more preferably 50 to 75 nm). The dielectric film may be formed from a silicon oxide film, a silicon nitride film, a silicon nitride oxide film, a DLC (Diamond Like Carbon) or an organic resin film. Further, a lamination film of these films may be used.

Thereafter, a pixel electrode 203 is formed as in Embodiment 1. A holding capacitor 204 is thus formed in a region where the light-shielding film 201 overlaps with the pixel electrode 203 through the dielectric film 202.

Figure 9B:
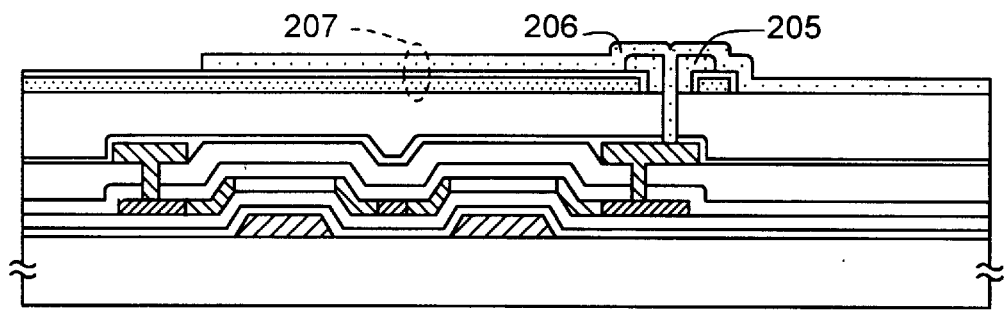

To obtain the structure shown in FIG. 9B, a spacer 205 is formed from an organic resin after forming a light-shielding film 201 and a dielectric film 202 in the same way as FIG. 9A. As the organic resin film, any of polyimide, polyamide, polyimideamide, acrylic, BCB (benzocyclobutene) films may be used. Then the spacer 205, a second interlayer insulating film 158, a passivation film 157 are etched to form a contact hole, forming a pixel electrode 206 from the same material as the one in Embodiment 1. In this way, a holding capacitor 207 is formed in a region where the light-shielding film 201 overlaps with the pixel electrode 206 through the oxide (dielectric film) 202. With the spacer 205 thus provided, short circuit that takes place between the light-shielding film 201 and the pixel electrode 206 may be prevented.

Figure 9C:
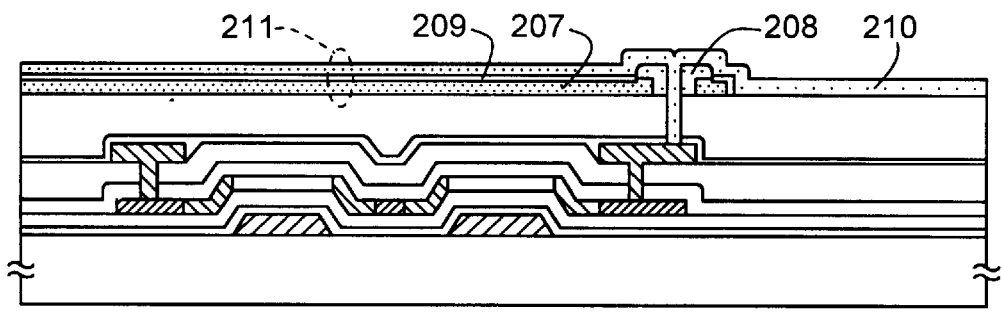

To obtain the structure shown in FIG. 9C, a light-shielding film 201 is formed in a manner similar to the one illustrated in FIG. 9A, and a spacer 208 is then formed from an organic resin so as to cover an end of the light-shielding film 201. As the organic resin film, any of polyimide, polyamide, polyimideamide, acrylic, BCB (benzocyclobutene) films may be used. Next, a dielectric film 209 is formed by anodic oxidation on an exposed surface of the light-shielding film 201. The dielectric film is not formed on a portion that is in contact with the spacer 208. Then the spacer 208, a second interlayer insulating film 158, a passivation film 157 are etched to form a contact hole, forming a pixel electrode 210 from the same material as the one in Embodiment 1. In this way, a holding capacitor 211 is formed in a region where the light-shielding film 201 overlaps with the pixel electrode 210 through the oxide (dielectric film) 209. With the spacer 208 thus provided, short circuit that takes place between the light-shielding film 201 and the pixel electrode 210 may be prevented.

Figure 10A:
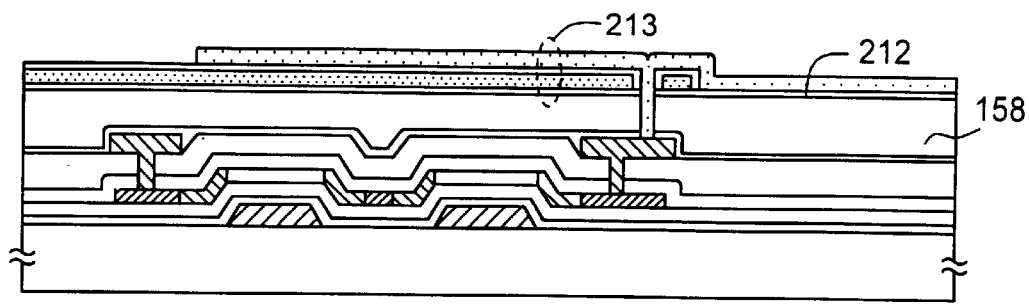
FIGS. 10A and 10B are sectional views showing the structure of the holding capacitor of Embodiment 4.

In FIG. 10A, a second interlayer insulating film 158 is formed in accordance with the process in Embodiment 1, and an insulating film 212 is formed thereon from a material such as a silicon nitride film, a silicon oxide film or a silicon nitride oxide film. The insulating film 212 is formed by a known film deposition method, most desirably, sputtering. Subsequent steps follows the one illustrated in FIG. 9A, in which a light-shielding film, a dielectric film and a pixel electrode are formed to form a holding capacitor 213. By forming the insulating film 212, adherence of the light-shielding film to the base film is improved to prevent the undesirable overgrowth of a dielectric film over the interface between the light-shielding film and the base film when the dielectric film is formed by anodic oxidation.

Figure 10B:
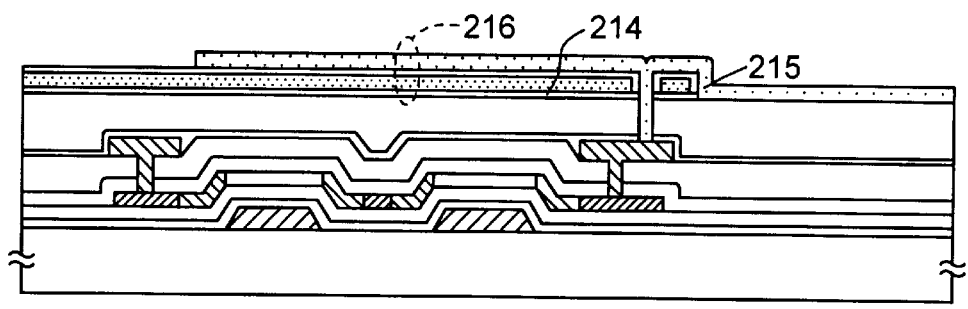

In FIG. 10B, after similarly forming an insulating film and a light-shielding film, a region of the insulating film where the insulating film is not in contact with the light-shielding film is etched and removed, and an insulating film 214 is formed below the light-shielding film so that it overlaps with the light-shielding film. A pixel electrode 215 is then formed. With this structure, adherence of the light-shielding film to the base film is improved to prevent the undesirable overgrowth of a dielectric film over the interface between the light-shielding film and the base film when the dielectric film is formed by anodic oxidation. The structure also improves the light transmittance of the pixel region where the light-shielding film is formed.

The structures shown in FIGS. 10A and 10B may be combined with the structures including spacers and illustrated in FIGS. 9B and 9C. Also, the structures shown in FIGS. 9A to 10B may be combined with the structures of Embodiments 1 and 2.

Embodiment 5

According to the methods of manufacturing an active matrix substrate provided with TFTs serving as the pixel portion and as the driver circuit formed in the periphery thereof, which are described in Embodiments 1 and 2, sputtering may be used to form a semiconductor film to be an active layer, insulating films including a gate insulating film, an interlayer insulating film and a base film, conductive films of a gate electrode, a source wiring, a drain wiring and a pixel electrode. The advantage of the use of sputtering is: a) its suitableness for forming a uniform film on a large area substrate because sputtering permits employment of direct current discharge system in forming conductive films and some other films, b) ensure of safety during manufacturing work because sputtering saves using silane ($SiH_4$), which requires great care in handling, when silicon-based materials such as an amorphous silicon film and a silicon nitride film are formed. These are of great benefit especially for practical manufacturing work where the advantageous points would be fully utilized. A manufacturing process that uses sputtering will be described below in accordance with Embodiment 1.

The gate electrodes 102 to 104 in FIG. 1A are readily formed by a known sputtering using a target material such as Ta, Ti, W and Mo. If intending to obtain gate electrodes of a compound material such as W—Mo and Ta—Mo, a compound target is similarly used. In the case of forming TaN or WN, a suitable amount of nitrogen ($N_2$) or ammonium ($NH_3$) is mixed into the sputtering atmosphere in addition to argon (Ar). As another method, helium (He), krypton (Kr) and xenon (Xe) are mixed into the sputtering gas in addition to argon (Ar) to control the internal stress of the film to be formed.

The silicon nitride film 105a used to form the gate insulating film 105 is formed by mixing suitable amounts of Ar, $N_2$, hydrogen ($H_2$) and $NH_3$ using a silicon (Si) target. A target material of silicon nitride may be used instead in similarly forming the gate insulating film. The silicon nitride oxide film 105b is formed by using a Si target, mixing suitable amounts of Ar, $N_2$, $H_2$ and $N_2O$, and sputtering.

Similarly, formation of the amorphous silicon film uses Si target, and, as the sputtering gas, Ar and $H_2$. If a slight amount of boron (B) is intended to be added to the amorphous silicon film, the target may be doped in advance with a several tens ppm to several thousands ppm of boron (B), or dibolane ($B_2H_6$) may be added to the sputtering gas instead.

A silicon oxide film used for the first spacer films 107 to 109 and the second spacer films 110 is formed by using silicon oxide (or quartz) as a target, and sputtering in Ar or a mixture gas of oxygen ($O_2$) and Ar. A silicon nitride film, a silicon oxide film or a silicon nitride oxide film used for the protective film 150, the interlayer insulating film 151 and the passivation film 157 is formed as described above.

When using Al for the source wirings 152 to 154 and the drain wirings 155, 156, it is effective in preventing hillock to add about 0.01 to 5 wt % of Ti, Si, scandium (Sc), vanadium (V) or Cu. A material that contains elements selected from Al, Ta and Ti and is used for the light-shielding film 159, and ITO, ZnO and $SnO_2$ for the pixel electrode 161 are both formed by a known sputtering.

As described above, every film except for the second interlayer insulating film 158 and the third interlayer insulating film that are made of an organic resin may be formed by sputtering. Incidentally, details about experimental conditions in practicing may be appropriately set by a person who carries out the invention.

Embodiment 6

Figure 6:
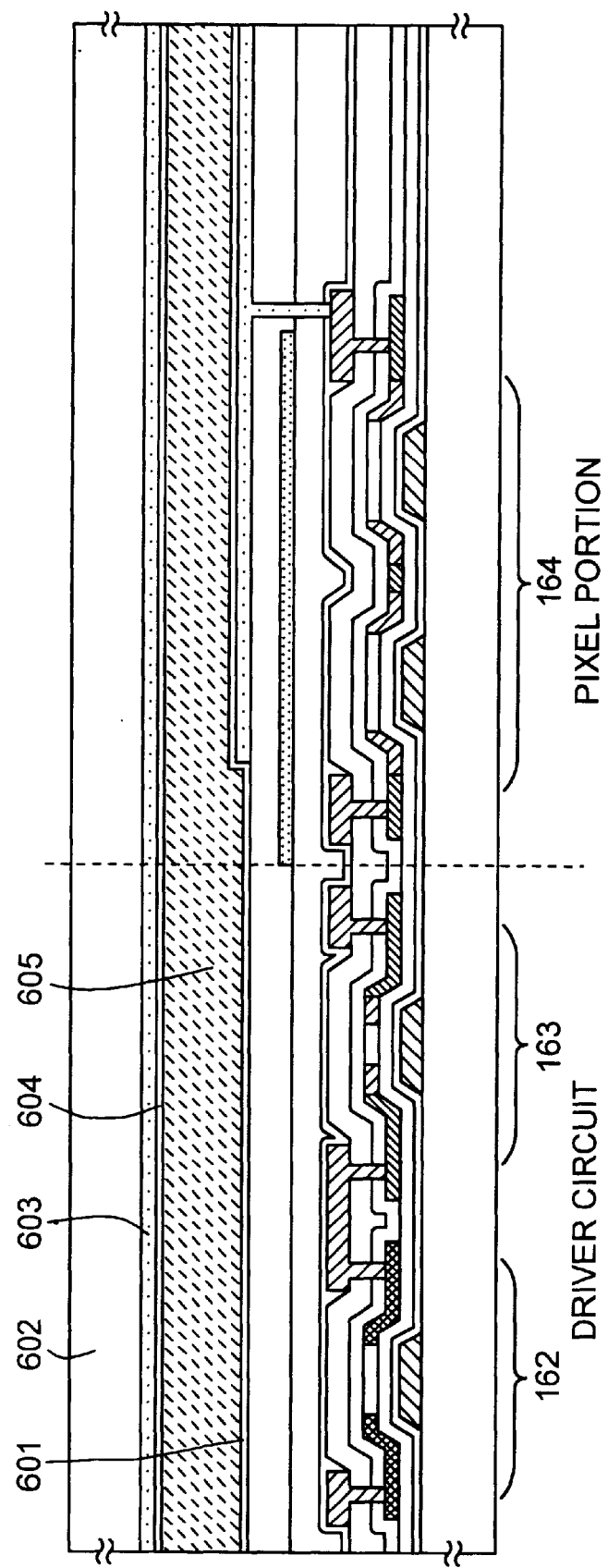
FIG. 6 is a structural diagram showing in section an active matrix liquid crystal display device of Embodiment 6.

In this embodiment, a process of manufacturing an active matrix liquid crystal display device from an active matrix substrate will be described. As shown in FIG. 6, an orientation film 601 is formed on the active matrix substrate fabricated in Embodiment 1 and illustrated in FIG. 1C. Usually, a polyimide resin is often used for an orientation film of a liquid crystal display element. A substrate 602 on the opposite side has a transparent conductive film 603 and an orientation film 604 which are formed thereon. After forming the orientation film, rubbing treatment is performed so that liquid crystal molecules are orientated at a certain pretilt angle. Then the active matrix substrate, on which the pixel portion and the CMOS circuit are formed, and the opposite substrate are bonded to each other by a known cell assembling process through a sealant or a spacer (neither is shown). A liquid crystal material 605 is thereafter injected between the substrates and the substrates are completely sealed with an end-sealing material (not shown). Known liquid crystals may be used for the liquid crystal material 605. Thus, the active matrix liquid crystal display device shown in FIG. 6 is completed.

Figure 7:
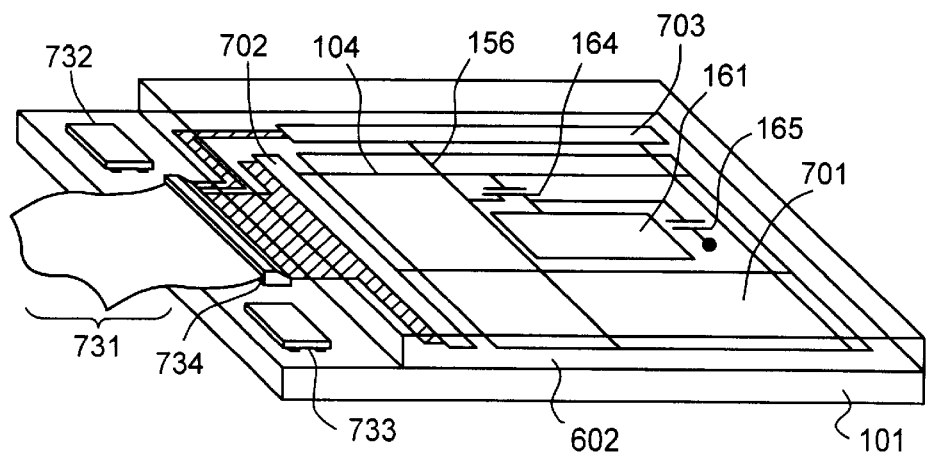
FIG. 7 is a perspective view showing an active matrix liquid crystal display device of Embodiment 6.
Figure 8:
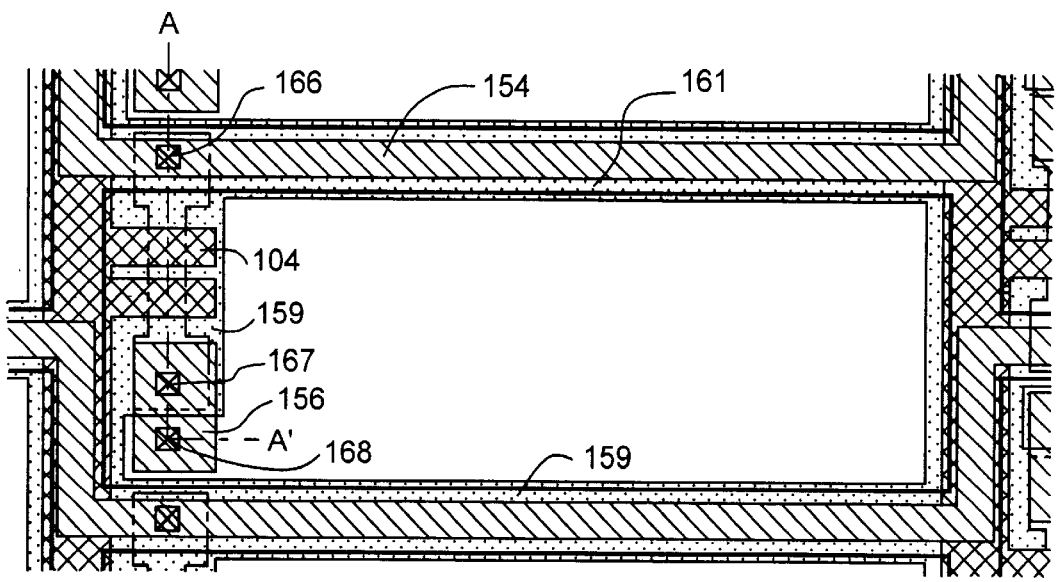
FIG. 8 is a top view of a pixel portion of Embodiment 6.

Next, the structure of this active matrix liquid crystal display device will be described with reference to a perspective view of FIG. 7 and a top view of FIG. 8. FIGS. 7 and 8 share the reference symbols with the sectional structural diagrams of FIGS. 1A to 2C and of FIG. 6 in order to correlate FIGS. 7 and 8 with those sectional structural diagrams. Also, the sectional structure taken along the line A–A' in FIG. 8 corresponds to the sectional view of the pixel portion in FIG. 2C.

The active matrix substrate is comprised of a pixel portion 701, a scanning (gate) line driver circuit 702 and a signal (source) line driver circuit 703 which are formed on a glass substrate 101. The pixel portion has an N channel TFT 164, and the driver circuits provided in the periphery of the pixel portion are formed using CMOS circuits as the base. The scanning (gate) line driver circuit 702 and the signal (source) line driver circuit 703 are connected to the pixel portion 701 through a gate wiring 104 (denoted by the same reference symbol as the gate electrode since the wiring is connected thereto and is the extension thereof) and through a source wiring 156, respectively. An FPC 731 is connected to an external input/output terminal 734.

FIG. 8 is a top view showing a part (one pixel) of the pixel portion 701. The gate wiring 104 intersects through a not-shown gate insulating film an active layer below the gate insulating film. Though not shown, a source region, a drain region, and Lov regions and Loff regions of n⁻ regions are formed in the active layer. Reference symbol 166 denotes a contact portion between the source wiring 154 and a source region 147, 167 denotes a contact portion between the drain wiring 156 and a drain region 149, and 168 denotes a contact portion between the drain wiring 156 and a pixel electrode 161. A holding capacitor 165 is formed in a region where a light-shielding film 159 overlaps with the pixel electrode 161 on the N channel TFT 164.

The active matrix liquid crystal display device in this embodiment is explained in accordance with the structure described in Embodiment 1. However, this may be freely combined with any of the structures shown in Embodiments 1 through 5 to fabricate an active matrix liquid crystal display device.

Embodiment 7

An active matrix substrate in which a pixel portion and a driver circuit formed by implementing the present invention, are formed integrally on the same substrate can be applied to various electro-optical devices (active matrix liquid crystal display device, active matrix EL display device, and active matrix EC display device). Namely, the present invention may be applied to all electronic equipments that incorporate those electro-optical devices as display devices.

The following can be enumerated as those types of electronic equipments: video cameras; digital cameras; projectors (rear type or front type); head mount displays (goggle type displays); car navigation systems; personal computers; portable telephones, electronic books, etc. Some examples of these are shown in FIGS. 12A to 12F.

Figure 12A:
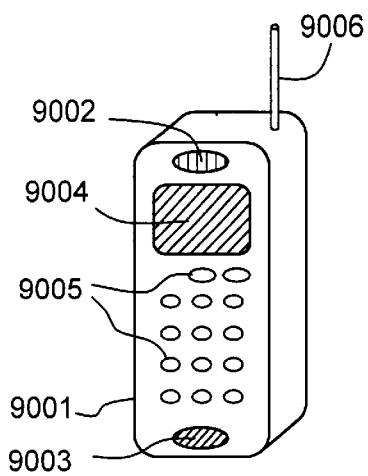
FIGS. 12A to 12F are diagrams showing examples of a semiconductor device of Embodiment 7.

FIG. 12A is a portable telephone, and is composed of a main body 9001, a sound output section 9002, a sound input section 9003, a display device 9004, operation switches 9005, and an antenna 9006. The present invention can be applied to the sound output section 9002, the sound input section 9003, and to the display device 9004 provided with the active matrix substrate.

Figure 12B:
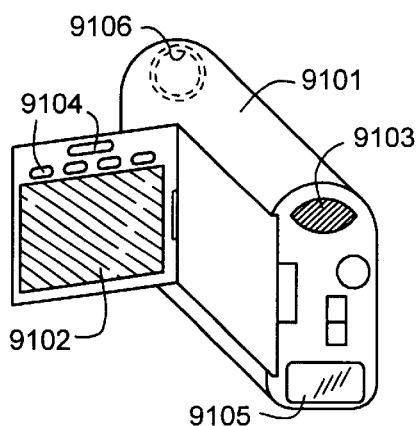

FIG. 12B is a video camera, and is composed of a main body 9101, a display device 9102, a sound input section 9103, operation switches 9104, a battery 9105, and an image receiving section 9106. The present invention can be applied to the sound input section 9103 and the display device 9102 provided with the active matrix substrate, and to the image receiving section 9106.

Figure 12C:
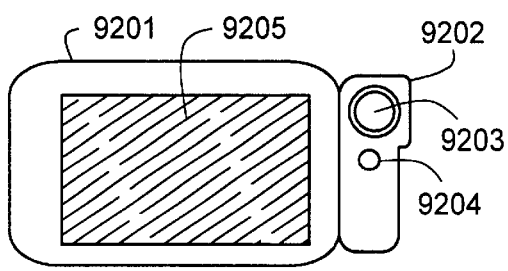

FIG. 12C is a mobile computer, and is composed of a main body 9201, a camera section 9202, an image receiving section 9203, operating switches 9204, and a display device 9205. The present invention can be applied to the image receiving section 9203 and to the display device 9205 provided with the active matrix substrate.

Figure 12D:
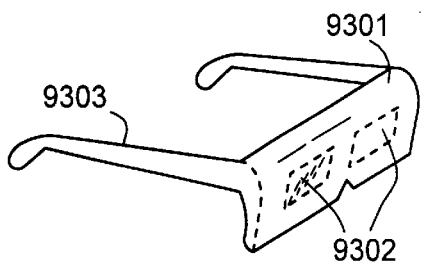

FIG. 12D is a goggle type display, and is composed of a main body 9301, a display device 9302, and an arm section 9303. The present invention can be applied to the display device 9302. Although not shown, the present invention can be applied to other signal control circuits.

Figure 12E:
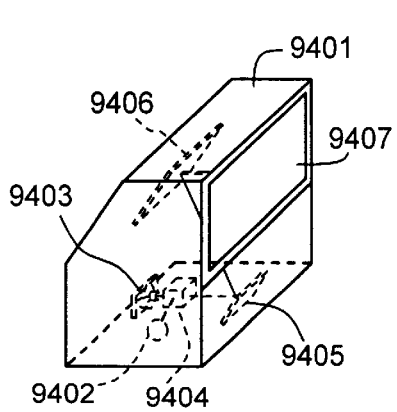

FIG. 12E is a rear type projector, and is composed of a main body 9401, a light source 9402, a display device 9402, a polarizing beam splitter 9404, reflectors 9405, 9406, and a screen 9407. The present invention may be applied to the display device 9403.

Figure 12F:
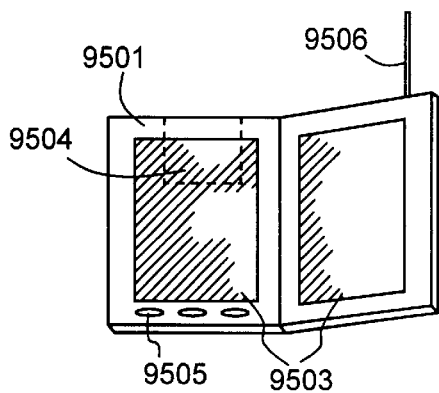

FIG. 12F is a portable book, and is composed of a main body 9501, display devices 9502, 9503, a recording medium 9504, operating switches 9505, and an antenna 9506. The book is used to display data stored in a mini-disk (MD) or a DVD, or a data received with the antenna. The display devices 9502, 9503 are direct-vision type display devices, to which the present invention may be applied.

Figure 13A:
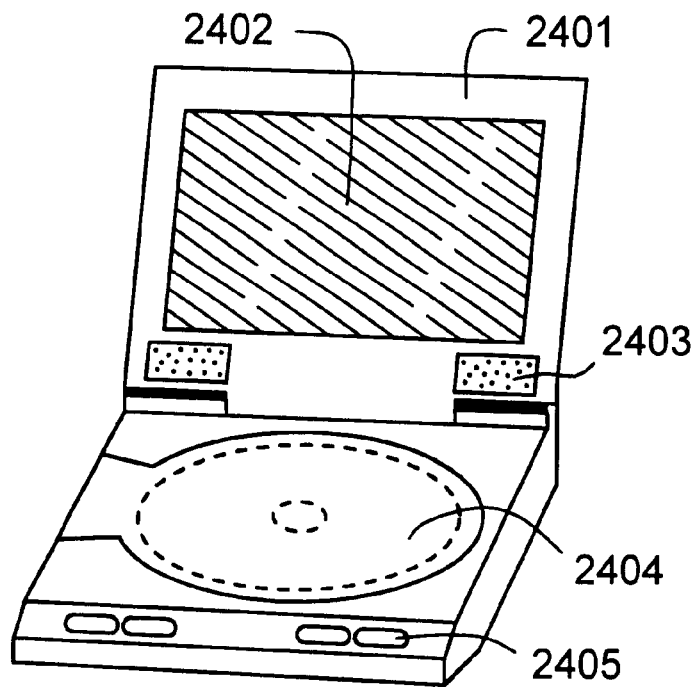
FIGS. 13A and 13B are diagrams showing examples of a semiconductor device of Embodiment 7.

FIG. 13A is a player that uses a recording medium on which a program is recorded (hereafter referred to simply as a recording medium), and is composed of a main body 2401, a display device 2402, a speaker section 2403, a recording medium 2404, and operating switches 2405. Note that a DVD (digital versatile disk), CD or the like is used as a recording medium for this player, thereby being capable of being used for music appreciation, film appreciation, games, and the Internet. The present invention can be applied to the display device 2402, and to other signal control circuits.

Figure 13B:
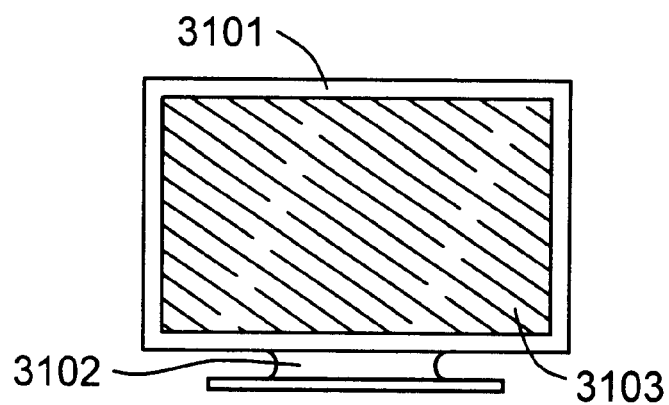

FIG. 13B is a display, and is composed of a main body 3101, a support base 3102, a display section 3103, etc. The present invention can be applied to the display section 3103. The display according to the present invention is advantageous when the display is particularly large-sized and is 10 inches or more in an opposite angle (particularly 30 inches or more).

Figure 14A:
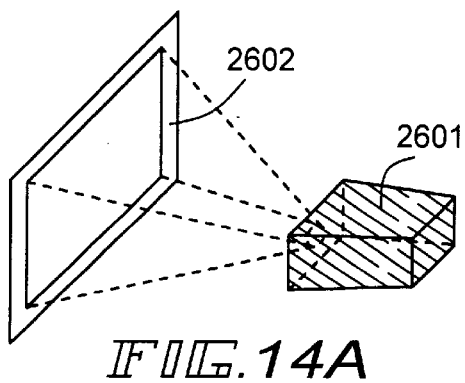
FIGS. 14A to 14D are diagrams showing examples of a projector of Embodiment 7.

FIG. 14A is a front type projector, and is composed of a projection device 2601, a screen 2602, etc. The present invention can be applied to a liquid crystal display device 2808 that constitutes a part of the projection device, and to other signal control circuits.

Figure 14B:
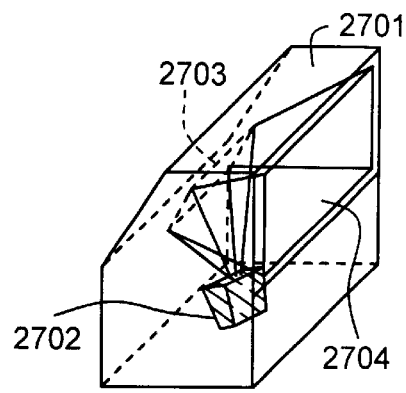

FIG. 14B is a rear type projector, and is composed of a main body 2701, a projection device 2702, a mirror 2703, a screen 2704, etc. The present invention can be applied to a liquid crystal display device 2808 that constitutes a part of the projection device 2702, and to other signal control circuits.

Figure 14C:
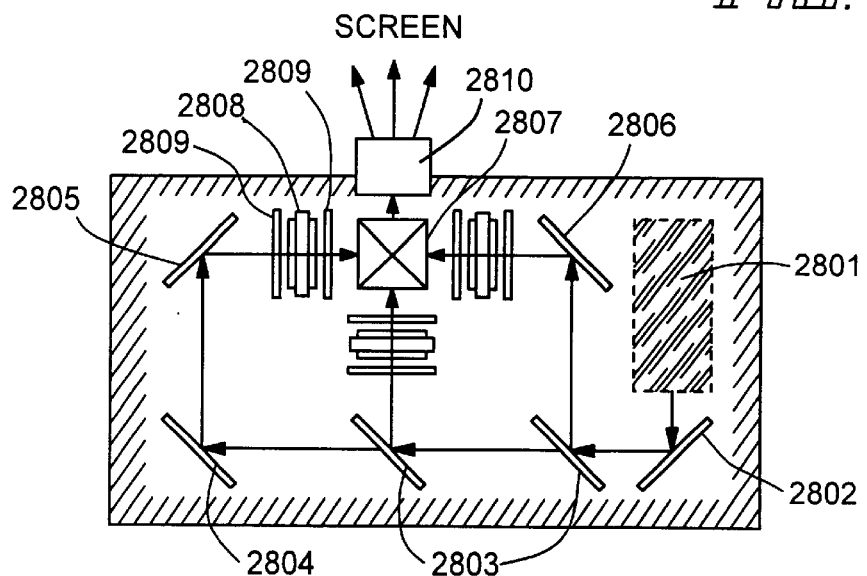

Further, FIG. 14C is a drawing showing one example of the structure of the display devices 2601 and 2702 shown in FIGS. 14A and 14B. The display devices 2601 and 2702 consist of an optical light source system 2801, mirrors 2802 and 2804 to 2806, a dichroic mirror 2803, a prism 2807, a liquid crystal display device 2808, a phase difference plate 2809, and an optical projection system 2810. The optical projection system 2810 is composed of an optical system including projection lens. Embodiment 7 shows an example of three plate type, but not particularly limited. For example, single plate type may be employed. Further, an operator may optionally set optical systems such as optical lenses, polarizing film, film to regulate the phase difference, and IR films within the optical path shown by an arrow in FIG. 14C.

Figure 14D:
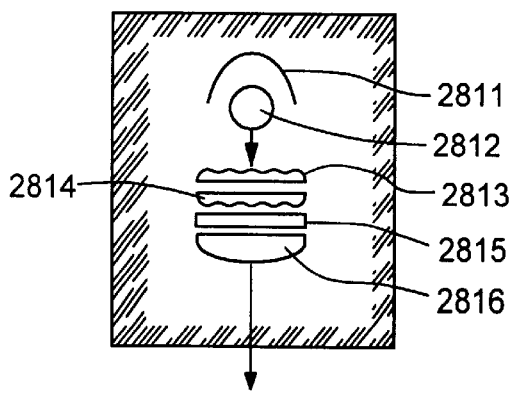

In addition, FIG. 14D shows one example of the structure of the optical light source system 2801 in FIG. 14C. In this embodiment, the optical light source system 2801 is composed of a reflector 2811, a light source 2812, lens arrays 2813 and 2814, a polarizing conversion element 2815, and a condenser lens 2816. Note that the optical light source system shown in FIG. 14D is one example, and but not particularly limited thereto. Further, an operator may optionally set optical systems such as optical lenses, polarizing film, film to regulate the phase difference, and IR films within the optical path shown by an arrow in FIG. 14D.

Note that the projector shown in FIGS. 14A–14D is a case in which a transmission type electro-optical equipment is used, and no application example in which a reflection type electro-optical equipment or an EL display device is used, is not illustrated.

Although not shown in this embodiment, the present invention can be applied to a display section of a car navigation system, an image sensor, and a personal computer. As described above, an applicable range of the present invention is extremely wide, and it can be applied to electronic equipment in all fields. Further, the electronic equipment of this embodiment can be realized by using a structure in combination with any of embodiments 1 to 6.

Embodiment 8

Figure 15A:
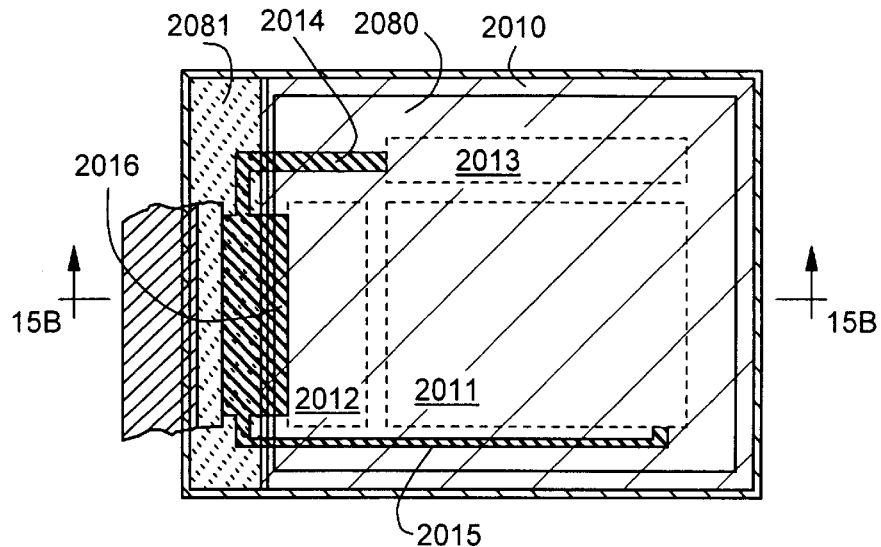
FIGS. 15A and 15B are a top view and a sectional view showing a construction of an EL display device of Embodiment 8.

This embodiment represents an example where self light emitting type display panel using an electro-luminescence material (EL) is fabricated by applying the active matrix substrate shown in FIG. 2C. FIG. 15A is a top view of the display panel using the present invention. In FIG. 15A, reference numeral 2010 denotes a substrate and reference numeral 2011 denotes a pixel portion. Reference numeral 2012 denotes a source side driving circuit and reference numeral 2013 denotes a gate side driving circuit. These driving circuits extend to an FPC 2017 through lead wires 2014 and 2016 and are connected to an external appliance.

Figure 15B:
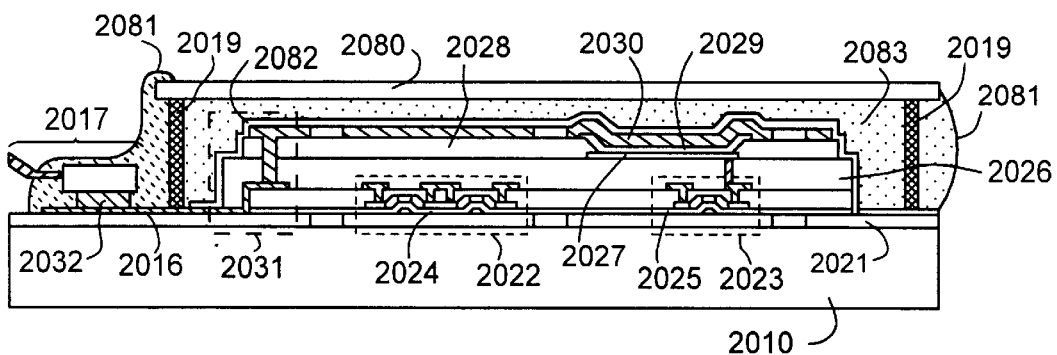

FIG. 15B shows the section taken along a line A–A' of FIG. 15A, and an opposing plate 2080 is disposed over at least the pixel portion, preferably over the driving circuits and the pixel portion. The opposing plate 2080 is bonded by a sealing material 2019 to the active matrix substrate on which the TFTs and the EL layer are formed. The sealing material 2019 contains a filler (not shown), and the two substrates are bonded while keeping a substantially uniform spacing by this filler. The outside of the sealing material 2019 and the upper surface and the peripheral portion of the FPC 2017 are sealed by a sealant 2081. The sealant 2081 uses a material such as a silicone resin, an epoxy resin, a phenol resin, a butyl rubber, or the like.

When the active matrix substrate 2010 and the opposing substrate 2080 are bonded by the sealing material 2019 as described above, a space is defined between them. A packing agent 2083 is packed into this space. The packing agent has also the function of bonding the opposing plate 2080. The packing agent 2083 can use PVC (polyvinyl chloride), an epoxy resin, a silicone resin, PVB (polyvinyl butyral) or EVA (ethylene vinyl acetate). Since the EL layer is weak to the moisture and is likely to get deteriorated, a desiccating agent such as barium oxide is preferably contained in the packing agent 2083 in order to keep the hygroscopic effect. A passivation film 2082 comprising a silicon nitride film or a silicon nitride oxide film is formed on the EL layer so as to prevent corrosion by alkali elements contained in the packing agent 2083.

The opposing plate 2080 can use a glass plate, an aluminum plate, a stainless steel plate, a FRP (Fiberglass-Reinforced Plastics) plate, a PVF (polyvinyl fluoride) film, a Mylar film (trade name of Du Pont Co.), a polyester film, an acrylic film or an acrylic plate. Hygroscopicity can be improved by using a sheet having a sandwich structure in which an aluminum foil having a thickness of tens of $\mu$m is sandwiched between the PVF film and the Mylar film. In this way, the EL element is kept under the sealed state and is cut off from the atmospheric air.

In FIG. 15B, TFTs for the driving circuits (a CMOS circuit comprising the combination of n-channel TFTs and p-channel TFTs is hereby shown) 2022 and TFTs 2023 for the pixel portion (only the TFT for controlling the current to the EL element is hereby shown) are formed over the substrate 2010 and the underlying film 2021. Among these TFTs, the n-channel TFTs are equipped with the LDD region having the structure of the present invention in order to prevent the drop of the ON current resulting from the hot carrier effect and the drop of characteristics resulting from the Vth shift and the bias stress.

For example, the p-channel TFT 162 and the n-channel TFT 163 of the CMOS circuit shown in FIG. 2C can be used for the TFT 2022 for the driving circuit. For the TFTs 2023 for the pixel portion, an n-channel TFT 164 as shown FIG. 2C or a p-channel TFT having similar constitution thereto can be used.

To fabricate the active matrix substrate for producing the EL display device, however, a self light emitting layer 2029 is formed using an EL material on the pixel electrode 2027. The self light emitting layer 2029 can be formed by freely combining known EL materials (positive hole injection layer, positive hole transportation layer, light emitting layer, electron transportation layer or electron injection layer) into a laminate structure or a single-layered structure. Any structure can be employed in accordance with known technologies. The EL materials include low molecular weight type materials and high molecular weight type (polymer type) materials. When the low molecular weight type materials are used, vacuum deposition is employed. When the polymer materials are used, a simple method such as spin coating, printing or ink jetting can be employed.

The self light emitting layer 2029 is formed by a vacuum deposition method, an ink jetting method or a dispenser method using a shadow mask. In any case, color display becomes feasible when a light emitting layer capable of emitting light of a different wavelength for each pixel (red emitting layer, green emitting layer and blue emitting layer). It is further possible to employ a system that combines a color conversion layer (CCM) with color filters or a system that combines a white emitting layer with color filters. Needless to say, an EL device of monochroic emission can be produced, too.

After the self light emitting layer 2029 is formed, a cathode 2030 is formed on the self emitting layer 2029. The moisture and oxygen existing on the interface between the cathode 2030 and the self light emitting layer 2029 are preferably removed as much as possible. Therefore, it is necessary to continuously form the self light emitting layer 2029 and the cathode 2030 in vacuum, or to form the self light emitting layer 2029 in an inert atmosphere and then to form the cathode 2030 in vacuum without releasing the self light emitting layer 2029 to the atmospheric air. This embodiment can conduct the film formation by using a film formation apparatus of a multi-chamber system (cluster tool system).

This embodiment uses a laminate film of a LiF (lithium fluoride) film and an Al (aluminum) film as the cathode 2030. More concretely, a 1 nm-thick LiF (lithium fluoride) film is deposited on the self-light emitting layer 2029 by vacuum deposition, and a 300 nm-thick aluminum film is formed on the LiF film. Needless to say, a MgAg electrode as a known cathode material can be used, too. The cathode 2030 is connected to a wiring 2016 in a region represented by reference numeral 2031. The wiring 2016 is a power source line for supplying a predetermined voltage to the cathode 2030 and is connected to the FPC 2017 through an anisotropic conductive paste material 2032. A resin layer 2080 is further formed over the FPC 2017 to improve the bonding strength at this portion.

Contact holes must be bored in the interlayer insulating film 2026 and the insulating film 2028 to electrically connect the cathode 2030 and the wiring 2016 in the region 2031. The contact holes may be bored at the time of etching of the interlayer insulating film 2026 (at the time of formation of the contact holes for the pixel electrodes) or at the time of etching of the insulating film 2028 (at the time of formation of openings before the formation of the EL layer). When the insulating film 2028 is etched, the interlayer insulating 2026 may be etched collectively. In this case, if the interlayer insulating film 2026 and the insulating film 2028 are made of the same resin material, the shape of the contact holes becomes excellent.

The wiring 2016 is electrically connected to the FPC 2017 past through the space (which is sealed by the sealing agent 2081) between the seal 2019 and the substrate 2010. Other wirings 2014 and 2015 are electrically connected to the FPC 2017 past through and below the sealing material 2018 in the same way as the wiring 2016.

Figure 17A:
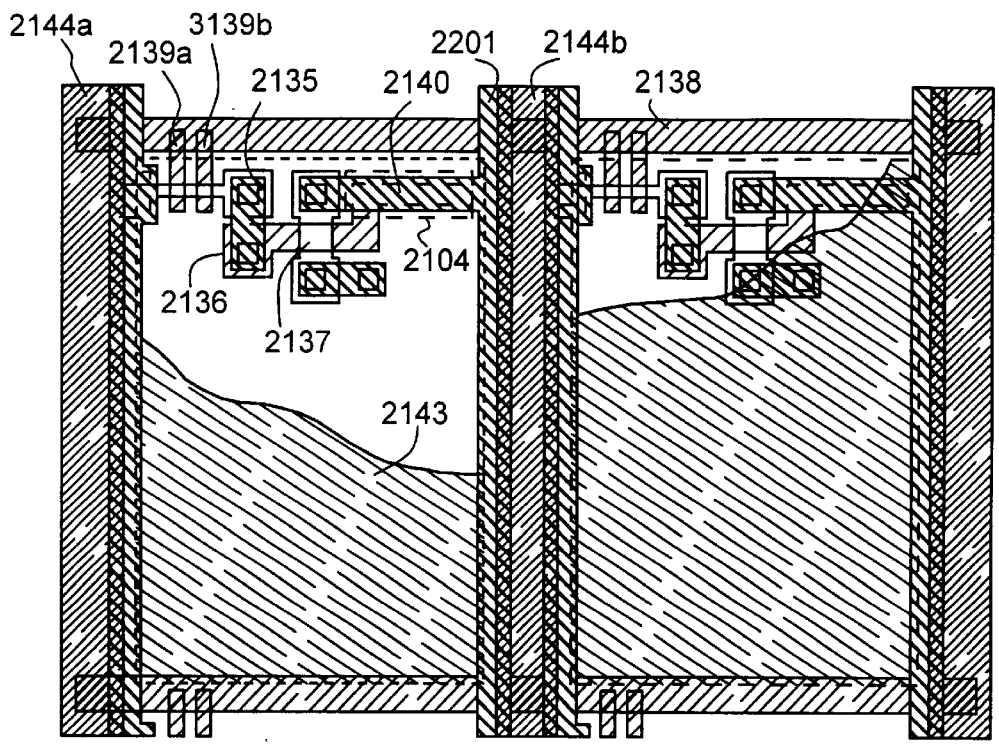
FIGS. 17A and 17B are a top view and a circuit diagram of the pixel portion of the EL display device of Embodiment 8.
Figure 17B:
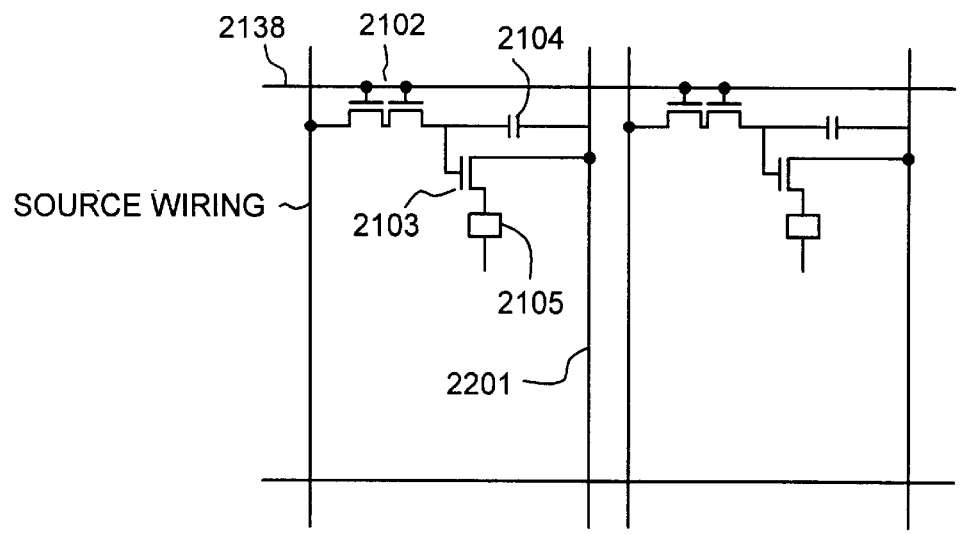

FIGS. 16A and 16B show more detailed sectional structures of the pixel portion. FIG. 17A shows its more detailed top structure and FIG. 17B shows its circuit diagram. In FIG. 16A, the switching TFT 2102 formed on the substrate 2101 is formed into the same structure as the n-channel TFT of the pixel matrix circuit shown in FIG. 2C. Because the double-gate structure is employed, the structure becomes the one in which two TFTs are substantially connected in series, and the OFF current value can be reduced advantageously. Incidentally, though this embodiment uses the double gate structurem, a triple-gate structure or a multi-gate structure having a greater number of gates may be employed, as well.

The current controlling TFT 2103 is formed using the n-channel TFT 163 of the CMOS circuit shown in FIG. 2C. At this time, the drain line 2135 of the switching TFT 2102 is electrically connected to the gate electrode 2137 of the current controlling TFT by a wiring 2136. The wiring 2138 is a gate line that electrically connects the gate electrodes 2139a and 2139b of the switching TFT 2102.

When the current controlling TFT 2103 and the switching TFT 2102 are hydrogenated in accordance with the method of the present invention, the main characteristics of the TFT such as field mobility, the sub-threshold constant (S value), the ON current, etc, can be improved, and variance of the individual TFTs can be reduced. Therefore, this hydrogenation process is extremely effective for producing the EL display element. Because various characteristics can be improved as described above, gradation display becomes easier, and because variance of the characteristics of the TFTs can be reduced, non-uniformity of image display can be eliminated and display quality can be improved.

Though the current controlling TFT 2103 is shown as having the single gate structure in this embodiment, it may have a multi-gate structure formed by connecting a plurality of TFTs in series. It is further possible to employ the construction in which a plurality of TFTs are connected in parallel to substantially divide the channel formation region into a plurality of regions so that heat radiation can be effected highly efficiently. Such a construction is effective as a counter-measure for degradation.

As shown in FIG. 17A, the wiring 2104 to serve as the gate electrode 2137 of the current controlling TFT 2103 overlaps with the drain line 2140 of the current controlling TFT 2103 through the insulating film in the region represented by reference numeral 2104. At this time, a capacitor is formed in this region 2104. The capacitor 2104 functions as a capacitor for holding a voltage applied to the gate of the current controlling TFT 2103. Incidentally, the drain line 2140 is connected to the current supply line (power source line) 2201, and a constant voltage is always applied thereto.

A first passivation film 2141 is disposed on the switching TFT 2102 and the current controlling TFT 2103, and a planarization film 2142 comprising a resin insulating film is formed on the first passivation film 2141. It is extremely important to planarize the level difference due to the TFTs by the use of the planarization film 2142. Because the self-light emitting layer to be later formed is extremely thin, the existence of any level difference might invite light emission defect. Therefore, planarization is preferably carried out before the pixel electrodes are formed so that the EL layer can be formed on a plane that is as planar as possible.

Reference numeral 2143 denotes a pixel electrode (cathode of the EL element) comprising a conductive film having high reflectivity. This pixel electrode 2143 is connected electrically to the drain of the current controlling TFT 2103. The pixel electrode 2143 preferably uses a conductive film having a low resistance such as an aluminum alloy film, a copper alloy film or a silver alloy film, or their laminate film. A laminate structure with other conductive films may naturally be used. A light emitting layer 2144 is formed inside a groove (corresponding to the pixel) defined by banks 2144a and 2144b made of an insulating film (preferably a resin). Though the drawing shows only one pixel, light emitting layers corresponding to R (red), G (green) and B (blue) may be formed dividedly. A conjugate polymer material is used for the organic EL material to form the light emitting layer. Typical examples of the polymer materials are poly-paraphenylene vinylene (PPV), polyvinyl carbazole (PVK) and polyfluorene. Incidentally, various PPV type organic EL materials are known. It is possible to select the materials described, for example, in H. Shenk, H. Becker, O. Gelsen, E. Kluge, W. Kreuder and H. Spreitzer, "Polymers for Light Emitting Diodes", Euro Display, Proceedings, 1999, p. 33–37, and in Japanese Patent Laid-Open No. 10-92576.

Concrete examples of the light emitting layers include cyano-polyphenylene vinylene as the red emitting layer, polyphenylene vinylene for the green emitting layer and polyphenylene vinylene or polyalkylphenylene for the blue emitting layer. The film thickness may be from 30 to 150 nm (preferably from 40 to 100 nm). However, these examples are merely an example of the organic EL materials that can be used as the light emitting layers, and they are not at all restrictive in any way. The EL layer (the layers for emitting light and for moving the carriers for light emission) may be formed by freely combining the light emitting layer, the charge transportation layer or the charge injection layer. For instance, though this embodiment illustrates the example using the polymer materials for the light emitting layer, low molecular weight organic EL materials may be used, as well. Inorganic materials such as silicon carbide can be used for the charge transfer layer and the charge injection layer. Known materials can be used for these organic EL materials and the inorganic materials.

This embodiment uses the EL layer having the laminate structure in which the positive hole injection layer 2146 made of PEDOT (polythiophene) or PAni (polvaniline) is disposed on the light emitting layer 2145. An anode comprising a transparent conductive film is placed on the positive hole injection layer 2146. In this embodiment the rays of light generated by the light emitting layer 2145 are emitted towards the upper surface side (above the TFT). Therefore, the anode must be light transmissible. A compound between indium oxide and tin oxide or a compound between indium oxide and zinc oxide can be used for the transparent conductive film. However, the transparent conductive film is preferably the one that can be film-formed at a temperature as low as possible because it is formed after the light emitting layer having low heat resistance and the positive hole injection layer are formed.

At the point when the anode 2147 is formed, the EL element 2105 is completed. Incidentally, the term "EL element" hereby means the capacitor comprising the pixel electrode (cathode) 2143, the light emitting layer 2145, the positive hole injection layer 2146 and the anode 2147. As shown in FIG. 17A, the pixel electrode 2143 corresponds substantially to the area of the pixel, and the pixel functions as a whole as the EL element. Therefore, utilization efficiency of light emission is extremely high and bright image display becomes possible.

Incidentally, the second passivation film 2148 is further disposed on the anode 2147 in this embodiment. A silicon nitride film or a silicon nitride oxide film is preferred as the second passivation film. The object of this film is to cut off the EL element from outside, and has technical significance of both preventing degradation due to oxidation of the organic EL material and restricting degassing from the organic EL material. In this way, reliability of the EL display device can be improved.

As described above, the EL display panel according to the present invention includes the pixel portion comprising the pixels each having the structure shown in FIGS. 15A and 15B, the switching TFT and the current controlling TFT. These TFTs that are fabricated by the hydrogenation method of the present invention exhibit extremely stable characteristics, and make it possible to effect excellent image display in the EL display device.

FIG. 16B shows an example where the radiating direction of the rays of light from the self light emitting layer is opposite to that direction shown in FIG. 16A. The current controlling TFT 2601 is formed from the p-channel TFT 162 of the CMOS circuit shown in FIG. 2C. The fabrication process is illustrated in Embodiment 1. This embodiment uses a transparent conductive film as the pixel electrode (anode) 2150. More concretely, it uses a conductor film made of a compound between indium oxide and zinc oxide. Naturally, a conductor film made of a compound between indium oxide and tin oxide can be used, too.

After the banks 2151a and 2151b comprising the insulating film are formed, the light emitting layer 2152 made of polyvinylcarbazole is formed by solution coating. An electron injection layer 2153 made of potassium acetyl acetonate (abbreviated as "acacK") and the cathode 2154 made of an aluminum alloy are formed on the light emitting layer 2152. In this case, the cathode 2154 functions also as the passivation film. In this way, the EL element 2602 is formed. In this embodiment, the rays of light generated by the light emitting layer 2153 are radiated towards the substrate on which the TFTs are formed, as indicated by an arrow. When the structure of this embodiment is employed, the current controlling TFT 2601 preferably comprises the p-channel TFT. Such an EL display element can be applied to the semiconductor device described in Embodiment 7.

Embodiment 9

Figure 18A:
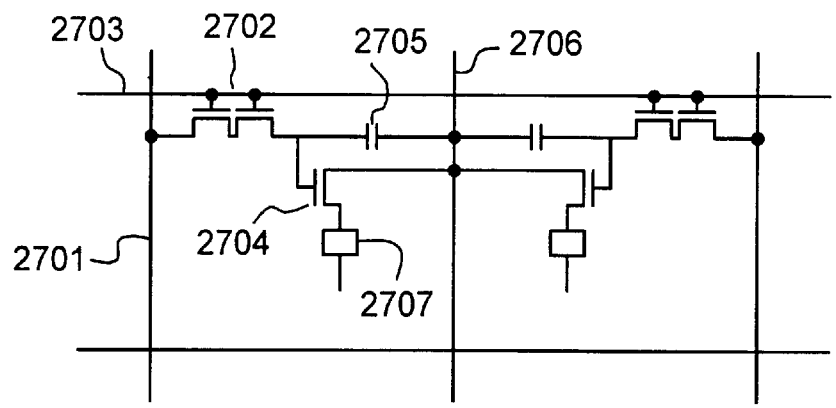
FIGS. 18A–18C are circuit diagrams of examples of the pixel portion of the EL display device of Embodiment 9.
Figure 18B:
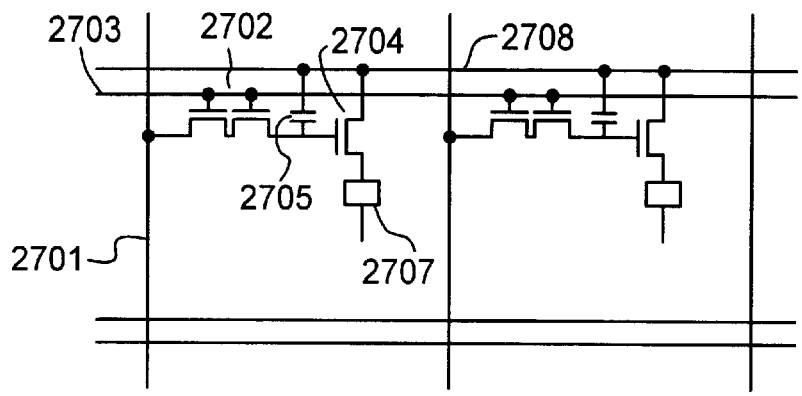
Figure 18C:
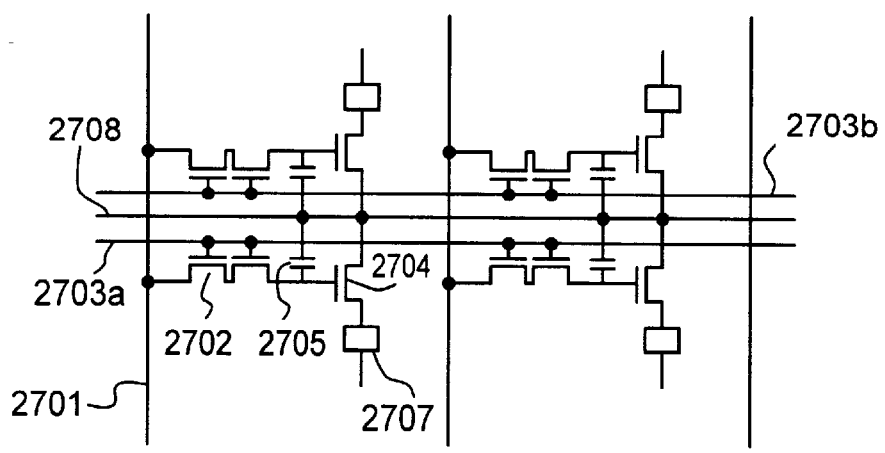

In this embodiment, FIGS. 18A–18C show examples where a pixel has a different structure from the structure of the pixel of the circuit diagram shown in FIG. 17B. Reference numeral 2701 denotes a source wiring of a switching TFT 2702 and reference numeral 2703 denotes a gate wiring of a switching TFT 2702. Reference numeral 2704 denotes a current controlling TFT and reference numeral 2705 denotes a capacitor. Reference numerals 2706 and 2708 denote current supply lines and reference numeral 2707 denotes an EL element.

FIG. 18A shows an example where the current supply line 2706 is used in common between two pixels. In other words, this embodiment is characterized in that two pixels are arranged in line symmetry with the current supply line 2706 as the center. In this case, since the number of power supply lines can be reduced, and the pixel portion can be further miniaturized.

FIG. 18B shows an example where the current supply line 2708 is disposed in parallel with the gate wiring 2703. Incidentally, in the structure shown in FIG. 18B, the current supply line 2708 and the gate wiring 2703 do not overlap with each other. They can be formed in such a manner as to overlap with each other through an insulating film provided that they are formed in different layers. In this case, since the power supply line 2708 and the gate wiring 2703 can share the occupying area, the pixel portion can be further miniaturized.

The structure shown in FIG. 18C is characterized in that the current supply line 2708 is disposed in parallel with the gate wiring 2703 in the same way as in the structure shown in FIG. 18B. Two pixels are formed in line symmetry with the current supply line 2708 as the center. It is also effective to dispose the current supply line 2708 in such a manner as to overlap with either one of the gate wirings 2703. In this case, since the number of the power supply lines can be reduced, the pixel portion can be further miniaturized. FIG. 18B shows the structure in which the capacitor 2705 is disposed for holding the voltage applied to the current controlling TFT 2704, but this capacitor 2705 can be omitted.

Because the n-channel TFT of the present invention shown in FIG. 16A is used for the current controlling TFT 2704, the TFT includes the LDD region so formed as to overlap with the gate electrode through the gate insulating film. A parasitic capacitance generally referred to as the "gate capacitance" is formed in this overlapping region, and this embodiment is characterized in that this parasitic capacitance is positively utilized in place of the capacitor 2705. The capacitance of this parasitic capacitance changes with the overlapping area between the gate electrode and the LDD region, and is determined by the length of the LDD region contained in the overlapping region. The capacitor 2705 can be omitted similarly in the structures shown in FIGS. 18A–18C.

With the present invention, in a semiconductor device (concretely electro-optical device, in this specification) having a plurality of functional circuits formed on the same single substrate, TFTs of suitable capability may be arranged in accordance with specifications the respective circuit require, greatly improving the operation characteristic and reliability of the semiconductor device.

In a bottom gate type or inverted stagger type TFT provided with LDD regions, in particular, the OFF current value may be markedly reduced to contribute to lowering power consumption of a pixel portion by forming LDD regions in an N channel type TFT of the pixel portion so as to be composed only of Loff regions with an n⁻ concentration. Also, the current driving capacity is enhanced and degradation due to hot carriers is prevented to reduce the degradation of the ON current value by forming LDD regions in an N channel type TFT of the driver circuit so as to be composed only of Lov regions with an n⁻ concentration.

In addition, the operation performance and reliability of a semiconductor device having such an electro-optical device as a display medium (electronic equipment in this embodiment) may be improved.

What is claimed is:

1. An EL display device comprising:
   a pixel portion and a driver circuit for the pixel portion over one substrate;
   a switching thin film transistor formed in the pixel portion and including:
      a first semiconductor film;
      at least a first LDD region in the first semiconductor film;
      a first gate insulating film formed between the first semiconductor film and the substrate;
      a first gate electrode formed between the first gate insulating film and the substrate;
   a current controlling thin film transistor formed in the pixel portion and including:
      a second semiconductor film;
      at least a second LDD region in the second semiconductor film;
      a second gate insulating film formed between the second semiconductor film and the substrate; and
      a second gate electrode formed between the second gate insulating film and the substrate,
   wherein the first LDD region includes an n-type impurity at a first concentration while the second LDD region includes the n-type impurity at a second concentration, wherein the second concentration is higher than the first concentration.

2. An EL display device according to claim 1, wherein the first LDD region of the switching thin film transistor in the pixel portion is not overlapped with the first gate electrode, wherein the second LDD region of the current controlling thin film transistor in the pixel portion is overlapped with the second gate electrode.

3. An EL display device according to claim 1, wherein the second concentration is two or more times higher than the first concentration while the second concentration does not exceed ten times the first concentration.

4. An EL display device according to claim 1 further comprising:
   an organic resin film formed on at least the current controlling thin film transistor in the pixel portion;
   an EL element formed on the organic resin film.

5. An EL display device according to claim 4, wherein the EL element comprises a pixel electrode, a light emitting layer and a cathode.

6. An EL display device according to claim 1, wherein the EL display device includes one selected from the group consisting of a cellular phone, a video camera, a mobile computer, a goggle type display, a projector, a portable electronic book, a digital camera, a navigation system for vehicles, and a personal computer.

7. An EL display device comprising:
   a pixel portion and a driver circuit for the pixel portion over one substrate;
   a bottom gate type switching thin film transistor formed in the pixel portion and including:
      a first gate electrode on an insulating surface;
      a first semiconductor island formed over the first gate electrode having a first gate insulating film interposed therebetween, said first semiconductor island including a first source region, a first drain region, a first channel region, and a pair of first lightly doped drain (LDD) regions;
   a bottom gate type current controlling thin film transistor formed in the pixel portion and including:
      a second gate electrode on the insulating surface;
      a second semiconductor island formed over the second gate electrode having a second gate insulating film interposed therebetween, said second semiconductor island including a second source region, a second drain region, a second channel region, and a pair of second LDD regions;
   wherein each of the first LDD regions includes an n-type impurity at a first concentration while each of the second LDD regions includes the n-type impurity at a second concentration,
   wherein the second concentration is higher than the first concentration.

8. An EL display device according to claim 7, wherein each of the first LDD regions of the bottom gate type switching thin film transistor in the pixel portion is partially overlapped with the first gate electrode, wherein each of the second LDD regions of the bottom gate type current controlling thin film transistor in the pixel portion is entirely overlapped with the second gate electrode.

9. An EL display device according to claim 7, wherein the second concentration is two or more times higher than the first concentration while the second concentration does not exceed ten times the first concentration.

10. An EL display device according to claim 7, further comprising:
an organic resin film formed on at least the bottom gate type current controlling thin film transistor in the pixel portion;
an EL element formed on the organic resin film.

11. An EL display device according to claim 10, wherein the EL element comprises a pixel electrode, a light emitting layer and a cathode.

12. An EL display device according to claim 7, wherein the EL display device includes one selected from the group consisting of a cellular phone, a video camera, a mobile computer, a goggle type display, a projector, a portable electronic book, a digital camera, a navigation system for vehicles, and a personal computer.

13. An EL display device according to claim 10, wherein the organic resin film comprises at least a material selected from the group consisting of polyimide, acrylic resin, polyamide, polyimideamide, BCB (benzocyclobutene).

14. An EL display device according to claim 7, wherein each of the second LDD regions has a length in a range of 0.5–3.0 µm, preferably 1.0 to 1.5 µm, in a channel length direction while each of the first LDD regions has a length in a range of 0.5 to 3.5 µm, typically 1.5 to 2.5 µm in the channel length direction.

15. An EL display device according to claim 7, wherein the first concentration is in a range of $1 \times 10^{17}$ to $2.5 \times 10^{18}$ cm$^{-3}$, while the second concentration is in a range of $2 \times 10^{17}$ to $5 \times 10^{18}$ cm$^{-3}$.

16. An EL display device according to claim 7, wherein the n-type impurity comprises phosphorus.

17. An EL display device comprising:
a pixel portion and a driver circuit formed over a substrate;
a switching thin film transistor formed in the pixel portion and including:
a first semiconductor film;
at least a first LDD region in the first semiconductor film;
a first gate insulating film formed between the first semiconductor film and the substrate; and
a first gate electrode formed between the first gate insulating film and the substrate,
a current controlling thin film transistor formed in the pixel portion and including:
a second semiconductor film;
at least a second LDD region in the second semiconductor film;
a second gate insulating film formed between the second semiconductor film and the substrate; and
a second gate electrode formed between the second gate insulating film and the substrate,
at least one CMOS circuit formed in the driver circuit and including an n-channel thin film transistor and a p-channel thin film transistor, the n-channel thin film transistor including:
a third semiconductor film;
at least a third LDD region in the third semiconductor film;
a third gate insulating film formed between the third semiconductor film and the substrate; and
a third gate electrode formed between the third gate insulating film and the substrate,
wherein the first LDD region contains an n-type impurity at a first concentration,
wherein the second LDD region contains the n-type impurity at a second concentration,
wherein the third LDD region contains the n-type impurity at a third concentration,
wherein the second concentration is higher than the first concentration.

18. An EL display device according to claim 17, wherein the third concentration is two or more times higher than the first concentration while the third concentration does not exceed ten times the first concentration.

19. An EL display device according to claim 17 further comprising:
an organic resin film formed on at least the current controlling thin film transistor in the pixel portion; and
an EL element formed on the organic resin film.

20. An EL display device according to claim 19, wherein the EL element comprises a pixel electrode, a light emitting layer and a cathode.

21. An EL display device according to claim 17, wherein the EL display device includes one selected from the group consisting of a cellular phone, a video camera, a mobile computer, a goggle type display, a projector, a portable electronic book, a digital camera, a navigation system for vehicles, and a personal computer.

22. An EL display device according to claim 19, wherein the organic resin film comprises at least a material selected from the group consisting of polyimide, acrylic resin, polyamide, polyimideamide and BCB (benzocyclobutene).

23. An EL display device according to claim 17, wherein the third LDD region has a length in a range of 0.5–3.0 µm, preferably 1.0 to 1.5 µm, in a channel length direction while the first LDD region has a length in a range of 0.5 to 3.5 µm, typically 1.5 to 2.5 µm in the channel length direction.

24. An EL display device according to claim 17, wherein the first concentration is in a range of $1 \times 10^{17}$ to $2.5 \times 10^{18}$ cm$^{-3}$, while the third concentration is in a range of $2 \times 10^{17}$ to $5 \times 10^{18}$ cm$^{-3}$.

25. An EL display device according to claim 17, wherein the n-type impurity comprises phosphorus.

26. An EL display device comprising:
a pixel portion and a driver circuit formed over a substrate;
a switching thin film transistor formed in the pixel portion and including:
a first semiconductor film;
at least a first LDD region in the first semiconductor film;
a first gate insulating film formed between the first semiconductor film and the substrate; and
a first gate electrode formed between the first gate insulating film and the substrate,
wherein the first LDD region partially overlaps the first gate electrode with the first gate insulating film interposed therebetween,
a current controlling thin film transistor formed in the pixel portion and including:
a second semiconductor film;
at least a second LDD region in the second semiconductor film;

a second gate insulating film formed between the second semiconductor film and the substrate; and a second gate electrode formed between the second gate insulating film and the substrate, wherein the second LDD region entirely overlap the second gate electrode with the second gate insulating film interposed therebetween, at least one CMOS circuit formed in the driver circuit and including an n-channel thin film transistor and a p-channel thin film transistor, the n-channel thin film transistor including:

a third semiconductor film;

at least a third LDD region in the third semiconductor film;

a third gate insulating film formed between the third semiconductor film and the substrate; and a third gate electrode formed between the third gate insulating film and the substrate, wherein the first LDD region contains an n-type impurity at a first concentration, wherein the second LDD region contains the n-type impurity at a second concentration, wherein the third LDD region contains the n-type impurity at a third concentration, wherein the second concentration is higher than the first concentration.

27. An EL display device according to claim 26, wherein the third concentration is two or more times higher than the first concentration while the third concentration does not exceed ten times the first concentration.

28. An EL display device according to claim 26 further comprising:

an organic resin film formed on at least the current controlling thin film transistor in the pixel portion; and an EL element formed on the organic resin film.

29. An EL display device according to claim 28, wherein the EL element comprises a pixel electrode, a light emitting layer and a cathode.

30. An EL display device according to claim 26, wherein the EL display device includes one selected from the group consisting of a cellular phone, a video camera, a mobile computer, a goggle type display, a projector, a portable electronic book, a digital camera, a navigation system for vehicles, and a personal computer.

31. An EL display device according to claim 28, wherein the organic resin film comprises at least a material selected from the group consisting of polyimide, acrylic resin, polyamide, polyimideamide and BCB (benzocyclobutene).

32. An EL display device according to claim 26, wherein the third LDD region has a length in a range of 0.5–3.0 $\mu$m, preferably 1.0 to 1.5 $\mu$m, in a channel length direction while the first LDD region has a length in a range of 0.5 to 3.5 $\mu$m, typically 1.5 to 2.5 $\mu$m in the channel length direction.

33. An EL display device according to claim 26, wherein the first concentration is in a range of $1\times10^{17}$ to $2.5\times10^{18}$ cm$^{-3}$, while the third concentration is in a range of $2\times10^{17}$ to $5\times10^{18}$ cm$^{-3}$.

34. An EL display device according to claim 26, wherein the n-type impurity comprises phosphorus.

* * * * *